United States Patent
Yamazaki et al.

(10) Patent No.: US 7,674,663 B2
(45) Date of Patent: *Mar. 9, 2010

(54) METHOD OF IRRADIATING LASER, LASER IRRADIATION SYSTEM, AND MANUFACTURING METHOD OF SEMICONDUCTOR DEVICE

(75) Inventors: Shunpei Yamazaki, Tokyo (JP); Koichiro Tanaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/678,083

(22) Filed: Oct. 6, 2003

(65) Prior Publication Data
US 2004/0069751 A1 Apr. 15, 2004

(30) Foreign Application Priority Data
Oct. 7, 2002 (JP) .............................. 2002-294305

(51) Int. Cl.
H01L 21/00 (2006.01)
(52) U.S. Cl. ................................ 438/166; 257/E29.151
(58) Field of Classification Search ................. 438/795, 438/487, 478, 482, 486, 149–167; 257/E29.151; 345/92
See application file for complete search history.

(56) References Cited

U.S. PATENT DOCUMENTS

| | | | |
|---|---|---|---|
| 5,304,357 A | * | 4/1994 | Sato et al. .................. 118/50.1 |
| 5,612,251 A | | 3/1997 | Lee |
| 5,643,801 A | | 7/1997 | Ishihara et al. |
| 5,811,751 A | * | 9/1998 | Leong et al. ............. 219/121.6 |

(Continued)

FOREIGN PATENT DOCUMENTS

EP 0 886 319 12/1998

(Continued)

OTHER PUBLICATIONS

European Search Report of Sep. 3, 2004 for EP 04 00 4257.

(Continued)

*Primary Examiner*—Brook Kebede
(74) *Attorney, Agent, or Firm*—Eric J. Robinson; Robinson Intellectual Property Law Office, P.C.

(57) ABSTRACT

In a manufacturing process of a semiconductor device, when harmonic of CW laser is irradiated to a semiconductor film with relatively scanning the harmonic, several long crystal grains extending in a scanning direction are formed. In the scanning direction, thus formed semiconductor film is substantially close to a single crystal in characteristic. However, the output of the harmonic of the CW laser is small to cause a low annealing efficiency. In the present invention, aid for the output is performed by irradiating second harmonic of CW laser and a fundamental wave of CW laser at the same time to the same portion. In general, the fundamental wave has a wavelength band around 1 μm, and is not well absorbed in a semiconductor film. When the harmonic with a wavelength of visible light or a shorter wavelength than visible light is irradiated at the same time as the fundamental wave to a semiconductor film, the annealing efficiency is remarkably increased since the fundamental wave is well absorbed in the semiconductor film melted by the harmonic.

21 Claims, 18 Drawing Sheets

U.S. PATENT DOCUMENTS

| | | |
|---|---|---|
| 5,891,764 A | 4/1999 | Ishihara et al. |
| 5,897,799 A | 4/1999 | Yamazaki et al. |
| 5,900,980 A | 5/1999 | Yamazaki et al. |
| 5,923,962 A | 7/1999 | Ohtani et al. |
| 5,953,597 A | 9/1999 | Kusumoto et al. |
| 5,959,779 A | 9/1999 | Yamazaki et al. |
| 6,002,523 A | 12/1999 | Tanaka |
| 6,020,224 A | 2/2000 | Shimogaichi et al. |
| 6,038,075 A | 3/2000 | Yamazaki et al. |
| 6,423,585 B1 * | 7/2002 | Yamazaki et al. ........... 438/166 |
| 6,426,245 B1 | 7/2002 | Kawasaki et al. |
| 6,451,631 B1 | 9/2002 | Grigoropoulos et al. |
| 6,528,397 B1 | 3/2003 | Taketomi et al. |
| 6,537,864 B1 | 3/2003 | Aya et al. |
| 6,544,825 B1 | 4/2003 | Yamazaki |
| 6,548,370 B1 | 4/2003 | Kasahara et al. |
| 6,645,454 B2 | 11/2003 | Voutsas |
| 6,693,257 B1 | 2/2004 | Tanaka |
| 6,700,096 B2 | 3/2004 | Yamazaki et al. |
| 6,803,296 B2 | 10/2004 | Miyairi |
| 6,806,498 B2 | 10/2004 | Taketomi et al. |
| 6,861,614 B1 | 3/2005 | Tanabe et al. |
| 6,884,699 B1 * | 4/2005 | Ogawa et al. ............... 438/489 |
| 6,897,166 B2 * | 5/2005 | Sotani et al. ................. 438/795 |
| 6,897,889 B2 | 5/2005 | Tanaka |
| 6,927,109 B1 | 8/2005 | Tanaka et al. |
| 7,026,227 B2 | 4/2006 | Tanaka |
| 7,056,810 B2 | 6/2006 | Yamazaki et al. |
| 7,102,750 B2 | 9/2006 | Takami |
| 7,125,761 B2 | 10/2006 | Tanaka |
| 7,160,764 B2 | 1/2007 | Tanaka |
| 7,498,212 B2 | 3/2009 | Tanaka |
| 2002/0031876 A1 | 3/2002 | Hara et al. |
| 2002/0094008 A1 | 7/2002 | Tanaka |
| 2003/0112322 A1 | 6/2003 | Tanaka |
| 2003/0136772 A1 * | 7/2003 | Yamazaki et al. ...... 219/121.73 |
| 2003/0148565 A1 | 8/2003 | Yamanaka |
| 2004/0040938 A1 * | 3/2004 | Yamazaki et al. ........ 219/121.6 |
| 2004/0119955 A1 | 6/2004 | Tanaka |
| 2004/0169023 A1 | 9/2004 | Tanaka |
| 2004/0171237 A1 * | 9/2004 | Tanaka et al. ............... 438/487 |
| 2004/0198028 A1 | 10/2004 | Tanaka et al. |
| 2004/0253838 A1 | 12/2004 | Yamazaki et al. |
| 2004/0259387 A1 * | 12/2004 | Yamazaki et al. ........... 438/795 |
| 2004/0266079 A1 | 12/2004 | Shimomura et al. |
| 2005/0067384 A1 * | 3/2005 | Talwar et al. ............ 219/121.6 |
| 2006/0019474 A1 | 1/2006 | Inui et al. |
| 2007/0158315 A1 | 7/2007 | Tanaka et al. |
| 2007/0184590 A1 | 8/2007 | Tanaka et al. |
| 2009/0072162 A1 | 3/2009 | Tanaka |

FOREIGN PATENT DOCUMENTS

| | | | |
|---|---|---|---|
| EP | 1 049 144 | | 11/2000 |
| JP | 53-029323 | | 3/1978 |
| JP | 56-029323 | | 3/1981 |
| JP | 57-104217 | | 6/1982 |
| JP | 57-183023 | | 11/1982 |
| JP | 402153582 A | * | 6/1990 |
| JP | 04-124813 | | 4/1992 |
| JP | 05-021340 | | 1/1993 |
| JP | 05-226790 | | 9/1993 |
| JP | 07-183540 | | 7/1995 |
| JP | 07-187890 | | 7/1995 |
| JP | 08-083765 | | 3/1996 |
| JP | 08-186268 | | 7/1996 |
| JP | 11-307450 | | 11/1999 |
| JP | 2000-012484 | | 1/2000 |
| JP | 2001-044120 | | 2/2001 |
| JP | 02001044120 | * | 2/2001 |
| JP | 2001044120 A | * | 2/2001 |
| JP | 2001-189458 | | 7/2001 |
| JP | 2002-217125 | | 8/2002 |
| JP | 2002-231628 | | 8/2002 |
| JP | 2002-261015 | | 9/2002 |
| JP | 2002-289524 | | 10/2002 |
| JP | 2003-051446 | | 2/2003 |
| JP | 2003-347237 | | 12/2003 |
| JP | 2004-128421 | | 4/2004 |
| WO | WO 02/061816 | | 8/2002 |
| WO | WO 2004/023537 | | 3/2004 |

OTHER PUBLICATIONS

Specification, Claims, Abstract of U.S. App. No. 10/787,120, filed Feb. 27, 2004.

Official Action dated Dec. 1, 2005 in U.S. Appl. No. 10/787,120, filed Feb. 27, 2004.

Official Action dated Jun. 8, 2006 for U.S. Appl. No. 10/787,120 to Tanaka.

Official Action dated Jun. 8, 2006 for U.S. Appl. No. 10/787,120 to Tanaka.

Official Action dated Sep. 25, 2006 for U.S. Appl. No. 10/787,120.

Offical Action dated Mar. 22, 2007 for U.S. Appl. No. 10/787,120.

Office Action (Chinese Patent Application No. 200410007632.7) dated Apr. 6, 2007.

Office Action (U.S. Appl. No. 10/787,120) Dated Nov. 18, 2008.

Official Action (U.S. Appl. No. 10/787,120) mailed Jun. 25, 2009.

Office Action (U.S. Appl. No. 10/787,120) Dated Nov. 1, 2007.

* cited by examiner

Fig. 2A
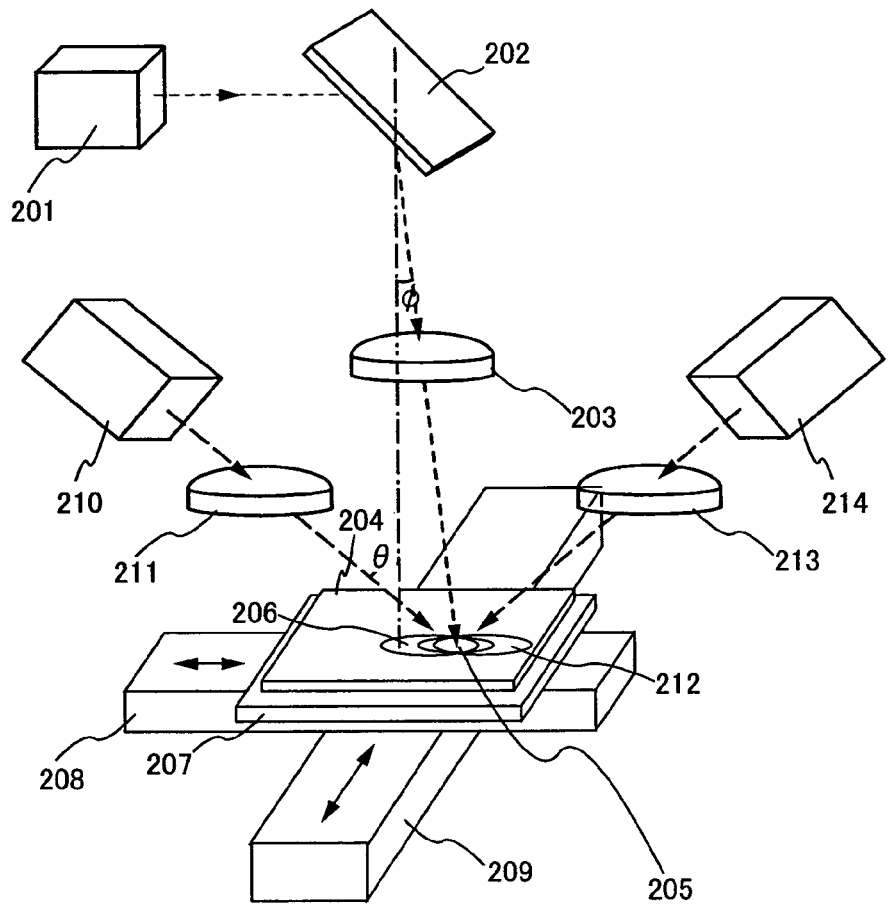
Fig. 2B
Top View
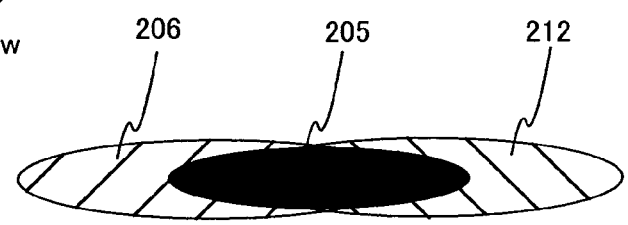
Side View
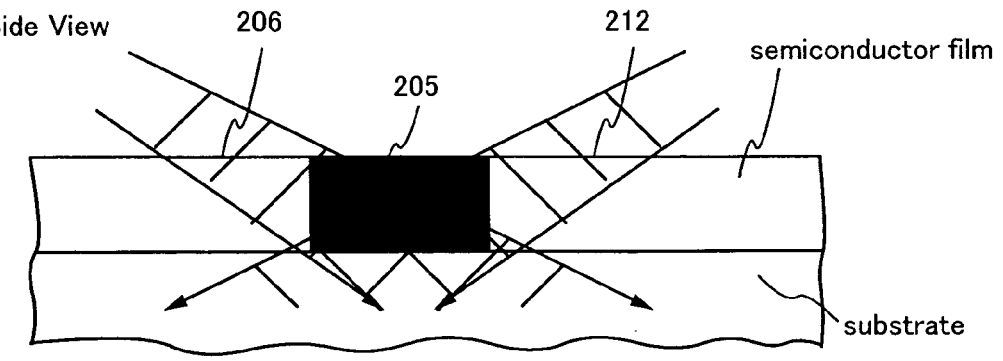

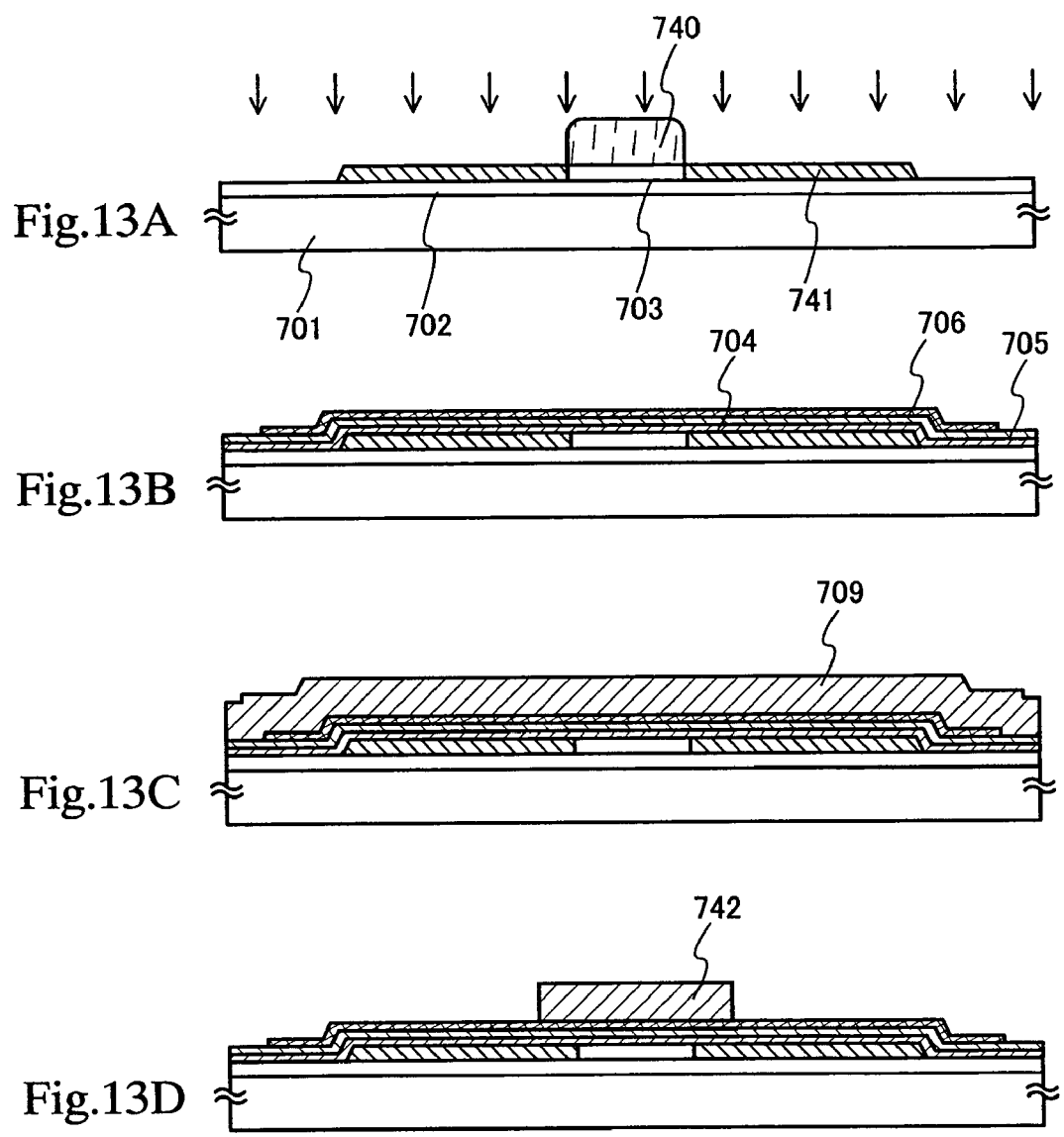

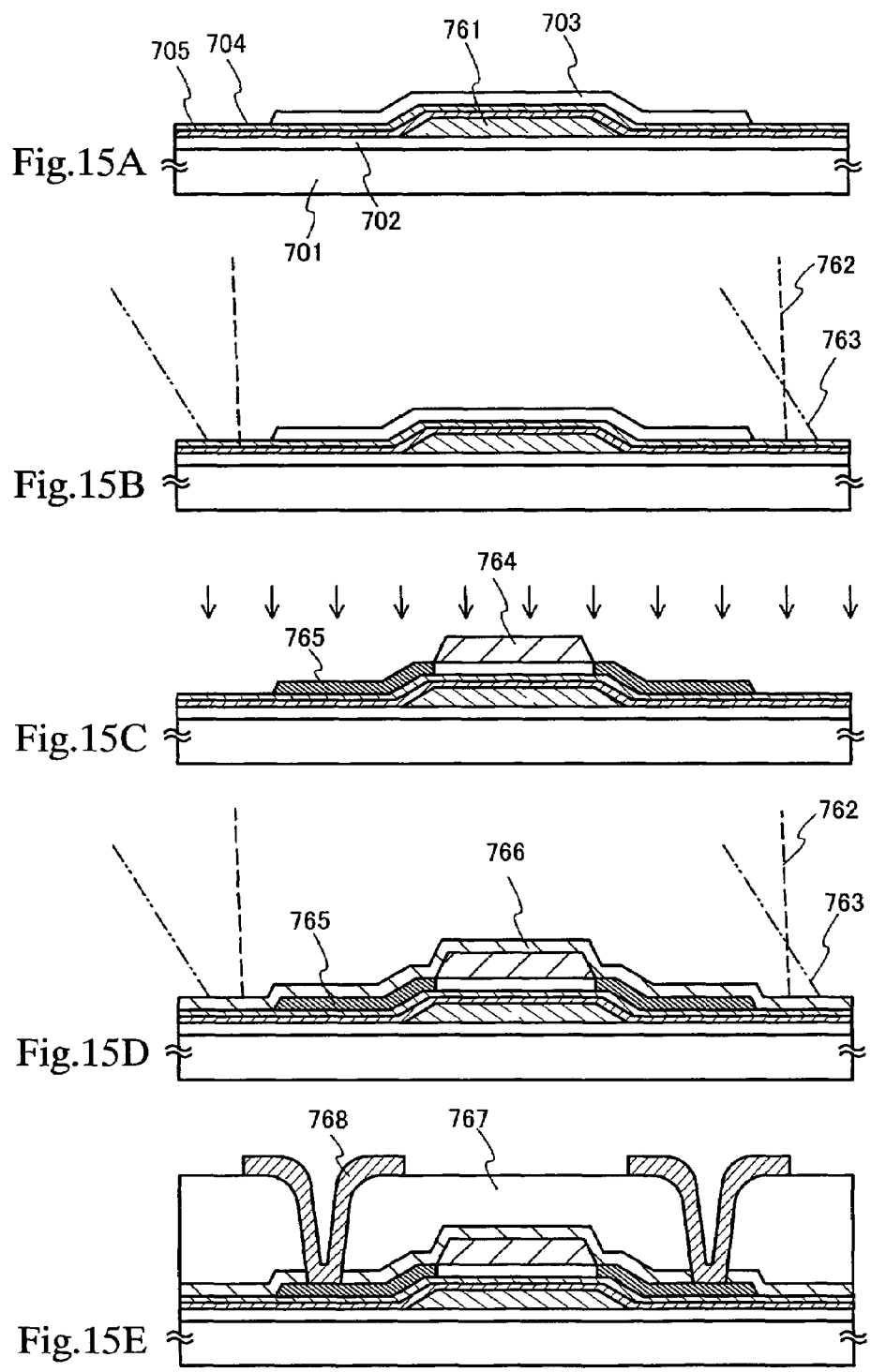

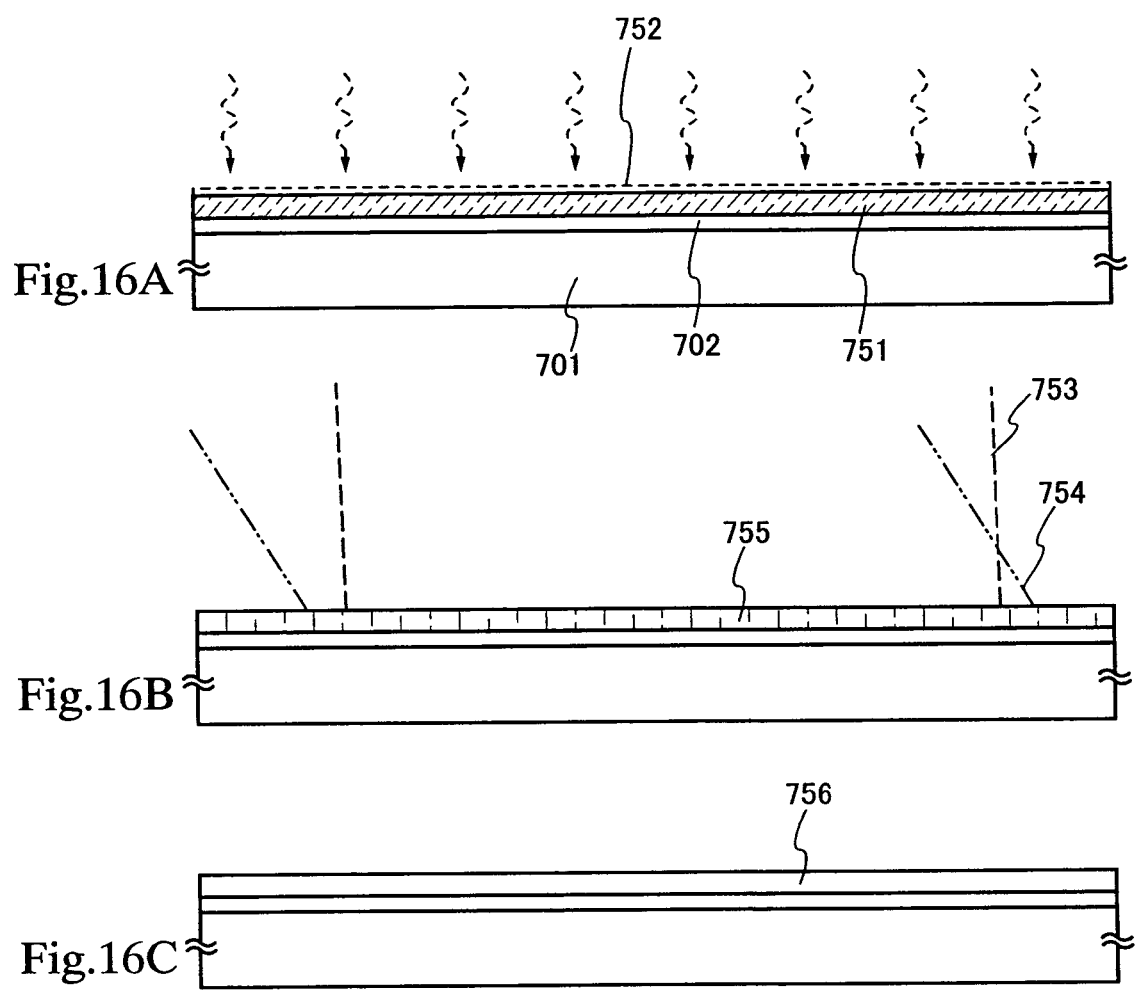

METHOD OF IRRADIATING LASER, LASER IRRADIATION SYSTEM, AND MANUFACTURING METHOD OF SEMICONDUCTOR DEVICE

BACKGROUND OF THE INVENTION

1. Field of the Invention

The present invention relates to a method of irradiating laser light, a laser irradiation system (including laser and an optical system for leading laser light output from the laser to an irradiated object (an object to be subjected to irradiation) for irradiating laser light, and a method of manufacturing a semiconductor device therewith.

2. Description of the Related Art

These days, wide research has been done on the technique of crystallizing an amorphous semiconductor film formed on an insulating substrate such as glass to form a semiconductor film with a crystalline structure (hereinafter, a crystalline semiconductor film). For crystallization, annealing such as thermal annealing with furnace annealing, rapid thermal annealing (RTA), or laser annealing has been examined. In crystallization, it is possible to employ one of these or to combine plural kinds thereof.

The crystalline semiconductor film has quite a high mobility, compared to the amorphous semiconductor film. Accordingly, the crystalline semiconductor film is used to form a thin film transistor (TFT), which is utilized, for example, for an active matrix liquid crystal display device that has a pixel portion including TFTs formed on a glass substrate or a pixel portion and a driving circuit both including TFTs formed on a glass substrate.

Usually, heat treatment at 600° C. or more for 10 hours or more is necessary in order to crystallize the amorphous semiconductor film with furnace annealing. Although it is quartz that is applicable to this crystallization as a material of the substrate, the quartz substrate is expensive, and especially, is really difficult to be processed into a large-sized substrate. It is given as a means for increasing a productive efficiency to make the substrate have a large size, and this is why research is done on the technique of forming the semiconductor film on the glass substrate that is inexpensive and easy to be process into a large-sized substrate. In recent years, it has been considered to use a glass substrate with a side over 1 m.

As an example of the research, thermal crystallization with a metal element has been developed, which makes it possible to lower a crystallizing temperature that used to be regarded as a problem. In the thermal crystallization, thermal treatment at 550° C. for 4 hours after adding a minute amount of element such as nickel, palladium, or zinc to the amorphous semiconductor film makes it possible to form the crystalline semiconductor film. Since the temperature of 550° C. is not higher than a deforming temperature of the glass substrate, there is no worry about deformation and the like (for example, Japanese Patent Laid-Open 7-183540)

In laser annealing, on the other hand, it is possible to give high energy to only the semiconductor film without increasing a temperature of the substrate too much. Accordingly, attention is paid to the laser annealing in terms of uses for not only the glass substrate with a low deforming temperature but also a plastic substrate and the like.

In an example of the laser annealing, pulse laser light represented by excimer laser is shaped in an optical system to become a square spot with several centimeters on a side or a linear shape with a length of 100 mm or more at an irradiated surface and the laser light is moved relatively with respect to an irradiated object to perform annealing. It is noted that the linear shape here does not mean a line strictly but means a rectangle (or an oblong) with a large aspect ratio. For example, the linear shape indicates a rectangle with an aspect ratio of two or more (preferably, 10 to 10000), which is included in laser light (rectangular shaped beam) that is rectangular in shape at the irradiated surface. The linear shape is necessary in order to secure an energy density for sufficient annealing to the irradiated object, and the laser light may have the rectangular shape or a planar shape providing that sufficient annealing can be performed to the irradiated object.

Thus manufactured crystalline semiconductor film has a plurality of crystal grains assembled, and the crystal grains have random positions and sizes. In order to manufacture a TFT in isolation on the glass substrate, the crystalline semiconductor film is divided into an island shaped pattern. In that case, it is too difficult to specify the position and the size of the crystal grain included in the island shaped pattern when the TFT is formed. Compared to an inside of the crystal grain, a boundary between the crystal grains (crystal grain boundary) has an amorphous structure and an infinite number of recombination centers and trapping centers existing due to crystal defects. It is known that when a carrier is trapped in the trapping center, potential of the crystal grain boundary increases to become a barrier against the carrier, and therefore, lowers a current transporting characteristic of the carrier. While the crystallinity of the semiconductor film of a channel forming region has an influence on characteristics of the TFT, it is almost impossible to form the channel forming region of a single-crystal semiconductor film by getting rid of the influence of the crystal grain boundary.

Recently, attention has been paid to the technique of irradiating continuous wave (CW) laser light to a semiconductor film while scanning with the CW laser in one direction to form a single-crystal grain extending long in the direction. It is considered that it is possible, with the technique, to form a TFT that has almost no crystal grain boundary at least in a cannel direction thereof.

In the technique, however, the CW laser with a wavelength band absorbed into the semiconductor film sufficiently is used. In the case of using YAG laser, for example, conversion into higher harmonic is necessary. Accordingly, only laser that has a quite small output on the order of 10 W is applicable and the productivity is inferior compared to the case of using excimer laser. It is noted that appropriate CW laser for the technique has a high output, a wavelength of visible light or a shorter wavelength than visible light, and particularly high stability of the output, and laser such as second harmonic of $YVO_4$ laser, second harmonic of YAG laser, second harmonic of YLF laser, second harmonic of $YAlO_3$ laser, and Ar laser is applicable. Although the other harmonic can be used for annealing without problems, there is a disadvantage of a small output. When the recited laser above is used for annealing, however, irregularity in irradiation is likely to occur. In addition, the output is quite mall, which has trouble in term of throughput.

SUMMARY OF THE INVENTION

The present invention has been accomplished in view of the problem above. It is an object of the present invention to provide a method of irradiating laser, a laser irradiation system, and related techniques thereto for correcting the irregularity in irradiation, enabling uniform laser treatment, and obtaining high throughput.

In a crystallization process of a semiconductor film with CW laser, in order to increase productivity as much as possible, the laser beam is processed into an oblong shape at an irradiated surface and scanning with the oblong shaped laser beam (hereinafter, oblong beam) in a direction of a minor axis thereof is performed to crystallize the semiconductor film. The processed laser beam is oblong in shape since the original laser beam is circular or generally circular in shape. When the original shape of the laser beam is rectangular, the laser beam may be enlarged in one direction with a cylindrical lens and processed into a long rectangular shape for crystallizing the semiconductor film similarly. In the specification, the oblong beam and the long rectangular beam collectively mean a long beam. Besides, a plurality of laser beams may be processed into long beams respectively and the long beams may be connected to make a further long beam. The present invention provides an irradiating method of the long beam with less irregularity in irradiation in such process and an irradiation system in a process such as the crystallization process.

The present invention provides a laser irradiation system including a first laser oscillator that outputs a first laser beam with a wavelength of visible light or a shorter wavelength than visible light, a means for processing the first laser beam emitted from the first laser oscillator into a long beam at an irradiated surface or a vicinity thereof, a second laser oscillator that outputs a second laser beam of a fundamental wave, a means for irradiating the second laser beam emitted from the second laser oscillator to a region of the irradiated surface, to which the long beam is irradiated, a means for relatively moving the irradiated surface in a first direction to the first and second laser beams, and a means for relatively moving the irradiated surface in a second direction to the first and second laser beams. It is noted that the first direction is orthogonal to the second direction.

In the laser irradiation system, each of the first and second laser oscillators has continuous wave gas laser, solid laser, or metal laser. The gas laser includes Ar laser, Kr laser, and $CO_2$ laser, the solid laser includes YAG laser, $YVO_4$ laser, YLF laser, $YAlO_3$ laser, ruby laser, alexandrite laser, and Ti:sapphire laser, and the metal laser includes helium-cadmium laser, and metal vapor laser such as copper vapor laser and gold vapor laser.

Also, the first laser beam is converted into higher harmonic with a nonlinear optical element. As a crystal used for the nonlinear optical element, crystals such as LBO, BBO, KDP, KTP, KB5, and CLBO are superior in terms of conversion efficiency. With the nonlinear optical element put in a resonator, it is possible to obtain considerably high conversion efficiency.

In addition, it is preferable that the first laser beam is emitted with an oscillation mode of $TEM_{00}$ since it becomes possible to improve uniformity of energy of the obtained long beam.

In the case of annealing a semiconductor film formed on a substrate with translucency to the laser beam, in order to realize uniform irradiation of the laser beam, it is desirable that an incident angle "$\phi$" of the laser beam satisfies the inequality of $\phi \geq \arctan(W/2d)$ when an incidence plane is defined as a plane that is perpendicular to the irradiated surface and is a plane including a longer side or a shorter side of the laser beam assuming that a shape of the laser beam is rectangular. In the inequality, "W" is a length of the longer side or the shorter side included in the incidence plane and "D" is a thickness of the substrate with translucency to the laser beam, which is placed at the irradiated surface. In the case of using a plurality of laser beams, the inequality needs to be satisfied with respect to each of the plurality of laser beams. It is noted that a track of the laser beam is projected to the incidence plane and the incident angle "$\phi$" is determined when the track is not on the incidence plane. When the laser beam is made to go at the incident angle "$\phi$", it is possible to perform uniform irradiation of the laser beam without interference of reflected light from a surface of the substrate with reflected light from a rear surface of the substrate. The theory above is considered assuming that a refractive index of the substrate is 1. In fact, the substrate mostly has a refractive index around 1.5, and a larger calculated value than the angle calculated in accordance with the inequality is obtained when the value around 1.5 is considered. However, since the laser beam at the irradiated surface has energy attenuated at both sides in the longitudinal direction thereof, the interference has a small influence on the both side and the value calculated in accordance with the inequality is enough to obtain the effect of attenuating the interference.

As the substrate, a glass substrate, a quartz substrate, a silicon substrate, a plastic substrate, a metal substrate, a stainless substrate, a flexible substrate, and the like can be used. As the glass substrate, a substrate of barium borosilicate glass or aluminum borosilicate glass can be given. Besides, the flexible substrate is a film substrate including one of polyethylene terephthalate (PET), polyethersulfone (PES), polyethylene naphthalate, (PEN), polycarbonate (PC), nylon, polyether ether ketone (PEEK), polysulphone (PSF), polyether imide (PEI), polyarylate (PAR), polybutylene terephthalate (PBT), polyimide, and acryl, and weight saving is anticipated when the flexible substrate is used to manufacture a semiconductor device. It is desirable to form a single layer film or a multi-layer film including one or more of barrier layers such as a film including aluminum (for example, AlON, AlN, or AlO), a carbon film such as a DLC (diamond-like carbon) film, and a SiN film on a surface of the flexible substrate or the surface and a rear surface thereof since the property such as durability is improved. The inequality with respect to $\phi$ is inapplicable to a substrate with no translucency to the laser beam because the thickness d of the substrate becomes a meaningless value at all in this case.

Further, the present invention provides a method of irradiating laser including the steps of processing a first laser beam with a wavelength of visible light or a shorter wavelength than visible light into a long beam at an irradiated surface or a vicinity thereof, and irradiating a second laser beam of a fundamental wave and the long beam at the same time to a region of the irradiated surface, to which the long beam is irradiated, while moving the irradiated surface relatively with respect to the long beam in a direction.

In the method of irradiating laser, each of the first and second laser beams is emitted from continuous wave gas laser, solid laser, or metal laser. The gas laser includes Ar laser, Kr laser, and $CO_2$ laser, the solid laser includes YAG laser, $YVO_4$ laser, YLF laser, $YAlO_3$ laser, ruby laser, alexandrite laser, and Ti:sapphire laser, and the metal laser includes helium-cadmium laser, and metal vapor laser such as copper vapor laser and gold vapor laser. The appropriate CW laser for the present invention is not limited to the laser given above providing that the output is high with high stability.

Also, the first laser beam is converted into higher harmonic with a nonlinear optical element. As a crystal used for the nonlinear optical element, crystals such as LBO, BBO, KDP, KTP, KB5, and CLBO are superior in terms of conversion efficiency. With the nonlinear optical element put in a resonator, it is possible to obtain considerably high conversion efficiency.

In addition, it is preferable that the first laser beam is emitted with an oscillation mode of $TEM_{00}$ since it becomes possible to improve uniformity of energy of the obtained long beam.

In the case of annealing a semiconductor film formed on a substrate with translucency to the laser beam, in order to realize uniform irradiation of the laser beam, it is desirable that an incident angle "φ" of the laser beam satisfies the inequality of φ≧arctan(W/2d) when an incidence plane is defined as a plane that is perpendicular to the irradiated surface and is a plane including a longer side or a shorter side of the laser beam assuming that a shape of the laser beam is rectangular. In the inequality, "W" is a length of the longer side or the shorter side included in the incidence plane and "d" is a thickness of the substrate with translucency to the laser beam, which is placed at the irradiated surface. In the case of using a plurality of laser beams, the inequality needs to be satisfied with respect to each of the plurality of laser beams. It is noted that a track of the laser beam is projected to the incidence plane and the incident angle "φ" is determined when the track is not on the incidence plane. When the laser beam is made to go at the incident angle "φ", it is possible to perform uniform irradiation of the laser beam without interference of reflected light from a surface of the substrate with reflected light from a rear surface of the substrate. The theory above is considered assuming that a refractive index of the substrate is 1. In fact, the substrate mostly has a refractive index around 1.5, and a larger calculated value than the angle calculated in accordance with the inequality is obtained when the value around 1.5 is considered. However, since the laser beam at the irradiated surface has energy attenuated at both sides in the longitudinal direction thereof, the interference has a small influence on the both side and the value calculated in accordance with the inequality is enough to obtain the effect of attenuating the interference.

As the substrate, a glass substrate, a quartz substrate, a silicon substrate, a plastic substrate, a metal substrate, a stainless substrate, a flexible substrate, and the like can be used. The inequality with respect to φ is inapplicable to a substrate with no translucency to the laser beam because the thickness d of the substrate becomes a meaningless value at all in this case.

Furthermore, the present invention provides a method for manufacturing a semiconductor device including the steps of processing a first laser beam with a wavelength of visible light or a shorter wavelength of visible light into a long beam at an surface of a semiconductor film or a vicinity thereof, and crystallizing the semiconductor film by irradiating a second laser beam of a fundamental wave and the long beam at the same time to a region of the surface, to which the long beam is irradiated, while moving the surface relatively with respect to the long beam in a direction.

The present invention provides another method for manufacturing a semiconductor device including the steps of processing a first laser beam with a wavelength of visible light or a shorter wavelength of visible light into a long beam at an surface of a semiconductor film or a vicinity thereof, and activating an impurity region formed in the semiconductor film by irradiating a second laser beam of a fundamental wave and the long beam at the same time to a region of the surface, to which the long beam is irradiated, while moving the surface relatively with respect to the long beam in a direction.

The present invention further provides another method for manufacturing a semiconductor device including the steps of forming a semiconductor layer over a glass substrate, forming an insulating layer for covering a top surface and side surface of the semiconductor layer, forming a conductive layer over the semiconductor layer with the insulating layer therebetween, processing a first laser beam with a wavelength of visible light or a shorter wavelength than visible light into a long beam at an irradiated surface or a vicinity thereof, and heating the conductive layer selectively to perform heat treatment of the semiconductor layer and the insulating layer by irradiating a second laser beam of a fundamental wave and the long beam at the same time to a region of the irradiated surface, to which the long beam is irradiated, while moving the irradiated surface relatively in a direction with respect to the long beam.

In the present invention above, each of the first and second laser beams is emitted from continuous wave gas laser, solid laser, or metal laser. What is necessary for the CW laser used for each of the first and second laser beams is that the output is high with high stability, and Ar laser, Kr laser, $CO_2$ laser, YAG laser, $YVO_4$ laser, YLF laser, $YAlO_3$ laser, ruby laser, alexandrite laser, and Ti:sapphire laser, helium-cadmium laser, metal vapor laser such as copper vapor laser and gold vapor laser, and the like can be used.

BRIEF DESCRIPTION OF THE DRAWINGS

In the accompanying drawings:

FIGS. 2A and 2B are diagrams for explaining Embodiment Mode 2;

FIGS. 13A to 13D are diagrams showing a manufacturing method of a semiconductor device according to an embodiment mode of the present invention;

FIGS. 15A to 15E are diagrams showing a manufacturing method of a semiconductor device according to an embodiment mode of the present invention;

FIGS. 16A to 16C are diagrams showing a manufacturing method of a semiconductor device according to an embodiment mode of the present invention;

DETAILED DESCRIPTION OF THE PREFERRED EMBODIMENTS

Embodiment Mode 1

Figure 1:
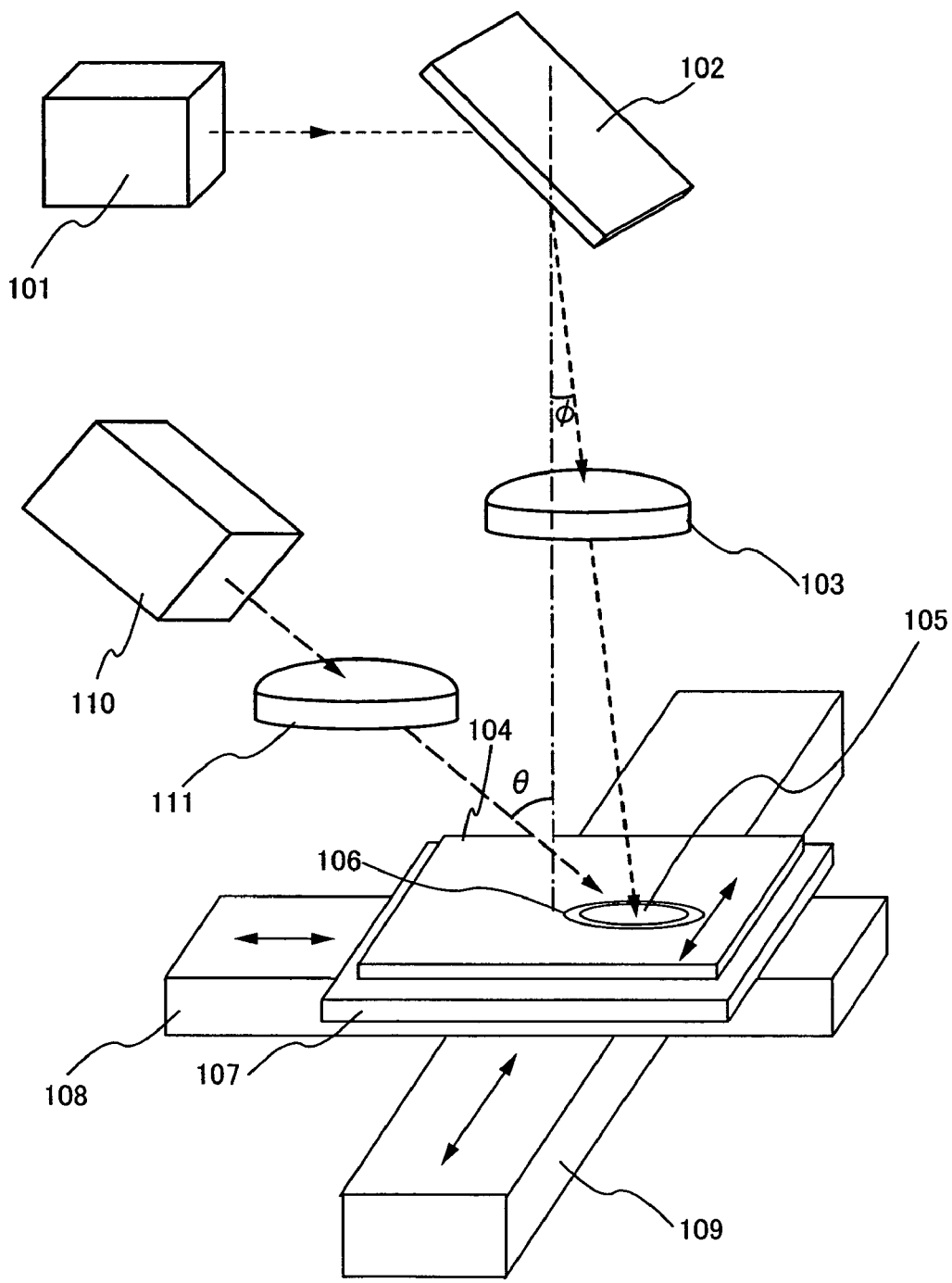
FIG. 1 is a diagram for explaining Embodiment Mode 1.

An embodiment mode of the present invention will be described with FIG. 1. The present embodiment mode shows the case of forming long beams 105 and 106 for irradiating a surface of a semiconductor film 104.

First, a laser oscillator 101 that outputs 10 W with LD excitation (Nd:YVO$_4$ laser, CW, second harmonic: 532 nm) is prepared. The laser oscillator 101 uses an oscillation mode of TEM$_{00}$ and has a LBO crystal incorporated in a resonator to perform conversion into second harmonic. Although it is not necessary in particular to limit the output laser beam to the second harmonic, the second harmonic is superior to further higher harmonic in terms of energy efficiency. The laser beam has a beam diameter of 2.25 mm and a divergence angle on the order of 0.3 mrad. A traveling direction of the laser beam is converted with a 45° reflecting mirror 102 to have an angle φ to the vertical direction. Then, the laser beam is made to go at the angle φ to the vertical direction into a planoconvex lens 103 that has a focal length of 20 mm and a plane portion that corresponds with the horizontal plane. Although the angle φ may be varied appropriately, the present embodiment mode has the angle φ of 20°. The semiconductor film 104 formed over a surface on a glass substrate is set at an irradiated surface parallel to the horizontal plane. A distance between the semiconductor film 104 and the planoconvex lens 103 is set on the order of 20 mm and fine adjusted in order to form the long beam 105 extending in a parallel direction to an incidence plane as much as possible on the semiconductor film 104. The fine adjustment has accuracy on the order of 50 μm. In this way, the oblong-like long bean 105 with major and minor axes respectively on the order of 500 μm and 20 μm is formed.

The substrate that has the semiconductor film 104 formed is the glass substrate with a thickness d, and is fixed to an absorption stage 107 in laser irradiation not to fall down. It is possible to move the absorption stage 107 with an uniaxial robot 108 for X axis and an uniaxial robot 109 for Y axis in X and Y directions on a parallel plane to the surface the semiconductor film 104. Since the foregoing inequality for no interference is φ≧arctan(W/2d), φ≧19.7° is obtained when the substrate has a thickness of 0.7 mm, for example.

Next, a laser oscillator 110 that outputs 30 W (Nd:YAG laser, CW, fundamental wave: 1.064 μm, TEM$_{00}$) is prepared. The laser beam has a divergence angle on the order of 3 mrad, and is made to go at an angle θ to the vertical direction into a planoconvex lens 111. The angle θ is set on the order of 40° and the planoconvex lens 111 has a focal length of 15 mm. Then, the oblong-like long beam 106 with 1 mm×0.2 mm is formed. The long beam 106 is arranged to cover the long beam 105.

A fundamental wave with a wavelength on the order of 1 μm is not absorbed much in a normal semiconductor thin film with insufficient efficiency. When the second harmonic is used at the same time, however, the fundamental wave is absorbed more in the semiconductor thin film melted by the second harmonic and the annealing efficiency of the semiconductor film becomes better. Namely, the increase in absorption coefficient due to liquefaction of the semiconductor film is utilized to make it possible to employ the fundamental wave in the present process, and there are the advantages such as suppressing a rapid change in temperature of the semiconductor film 104 and aiding energy of the laser beam of the second harmonic with the small output. Unlike the higher harmonic, it is not necessary for the fundamental wave to use a nonlinear optical element for converting a wavelength, and it is possible to obtain a laser beam with a quite large output, for example, with energy more than centuple of that of the higher harmonic. Since the proof strength of the nonlinear optical element against laser is quite weak, such energy difference is caused. In addition, the nonlinear optical element for generating the higher harmonic is likely to change in quality, and there is a disadvantage such as a difficulty in long keeping a maintenance-free state that is an advantage of solid laser. Accordingly, it is quite useful to aid the higher harmonic with the fundamental wave according to the present invention.

Next, an example of a manufacturing method of the semiconductor film will be described. The semiconductor film is formed over a transparent glass substrate to visible light. Specifically, a film containing silicon oxynitride is formed to have a thickness of 200 nm on one surface of a glass substrate with a thickness of 0.7 mm and an amorphous silicon (a-Si) film with a thickness of 70 nm is formed with plasma CVD thereon. Further, in order to improve resistance of the semiconductor film against laser, thermal annealing at 500° C. for 1 hour is performed to the semiconductor film. Instead of the thermal annealing, the crystallization of the semiconductor film with the metal element, mentioned in Description of the Related Art, may be performed. In either case, an optimum condition in irradiating a laser beam is almost the same.

Next, an example of laser irradiation to the semiconductor film 104 will be described. Although the output of the laser oscillator 101 is up to on the order of 10 W, the energy density thereof is efficient since the size of the long beam 105 is relatively small. Therefore, the laser irradiation is performed with the output turned down on the order of 5.5 W. The output of the laser oscillator 101 is set on the order of 15 W and the long beam 106 is formed to cover the long beam 105. The minor axis of the long beam 106 is ten times as long as the minor axis of the long beam 105. The substrate with the semiconductor film 104 formed is scanned in a direction of the minor axis of the long beam 105 with the uniaxial robot 109 for Y axis to enable to form paved single-crystal grains extending long in the scanning direction in a region with a width of 150 μm in a direction of the major axis of the long beam 105. In this laser irradiation, since the long beam 105 is covered with the long beam 106, the fundamental wave is irradiated to the semiconductor film 104 first, after that, the second harmonic is irradiated, and the fundamental wave is again irradiated lastly, which makes it possible to suppress a rapid change in temperature of the semiconductor film. Hereinafter, the region is referred to as a long crystal grain region. The laser beam with the higher harmonic has an incident angle of 20° or more, which suppresses interference to enable more uniform laser irradiation. Although the major axis of the long beam 105 has a length on the order 500 μm, the energy distribution thereof complies with Gaussian distribution because of the TEM$_{00}$ mode. Therefore, the long crystal grain region is formed only in the vicinity of the center of Gaussian distribution. The scan speed on the order of several hundreds to several thousands mm/s is appropriate, and the scan speed is set at 500 mm/s here.

Figure 6:
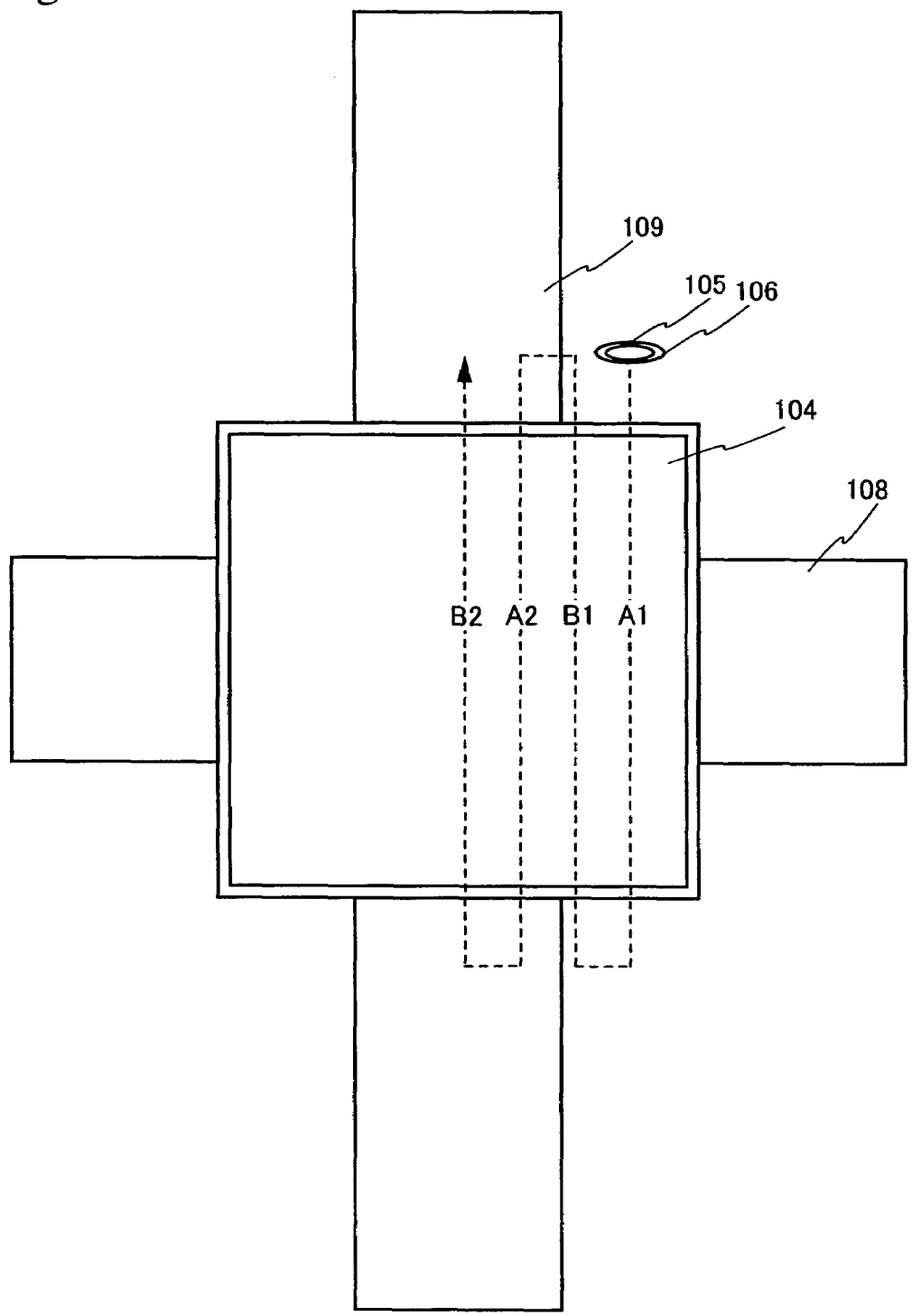
FIG. 6 is a diagram showing how to perform laser annealing.

FIG. 6 shows an irradiating method for forming a long crystal grain region all over a whole semiconductor film. For convenience of explanation, FIG. 6 has the same reference numbers as those in FIG. 1. The substrate that has the semiconductor film 104 formed is fixed to the absorption stage 107, and the laser oscillators 101 and 110 are made to work with the output of 5.5 W and 15 W, respectively. First, the uniaxial robot 109 for Y axis is used to scan the surface of the semiconductor film in a straight line at a scan speed of 500 mm/s. The straight line is corresponding to a portion of "A1" in FIG. 6. In FIG. 6, after laser is irradiated to a portion of outward "Am" (m is a positive integer) with the uniaxial robot 109 for Y axis, the uniaxial robot 108 for Y axis is used to shift the long beams in the direction of the major axis thereof by the width of the long crystal grain region and laser is irradiated to a portion of homeward "Bm". Such round of operation is repeated to enable the formation of the long crystal grain region all over the semiconductor film. It is noted that the semiconductor film in the long crystal grain region has quite superior characteristics. In particular, in the case of manufacturing a semiconductor device such as a TFT, the semiconductor device can be expected to show quite high electrical mobility. Conversely, when a portion of the semiconductor film requires no such superior characteristics it is unnecessary to form the long crystal grain region there. Therefore, a laser beam may not be irradiated to such portion, or irradiation may be performed not to form the long crystal grain region. In order to anneal the semiconductor film efficiently without forming the long crystal grain region, the scan speed may be increased, for example. When scanning is performed at a speed on the order of 2 m/s to the semiconductor film in which the long crystal grain region is formed providing the scan speed of 500 mm/s is set, an a-Si film can be crystallized to form a so-called general polysilicon (poly-Si) film without forming the long crystal grain region.

Embodiment Mode 2

In the present embodiment mode, an explanation will be given with reference to FIGS. 2A and 2B on an example in which a fundamental wave is used to more uniformize the energy distribution of the long beam shown in Embodiment Mode 1, which is obtained by processing the second harmonic.

First, a laser oscillator 201 that outputs 10 W with LD excitation (Nd:YVO$_4$ laser, CW, second harmonic: 532 nm) is prepared. The laser oscillator 201 uses an oscillation mode of TEM$_{00}$ and has a LBO crystal incorporated in a resonator to perform conversion into second harmonic. The laser beam has a beam diameter of 2.25 mm and a divergence angle on the order of 0.3 mrad. A traveling direction of the laser beam is converted with a 45° reflecting mirror 202 to have an angle φ to the vertical direction. Then, the laser beam is made to go at the angle φ to the vertical direction into a planoconvex lens 203 that has a focal length of 20 mm and a plane portion that corresponds with the horizontal plane. Although the angle φ may be varied appropriately, the present embodiment mode has the angle φ of 20°. A semiconductor film 204 formed over a surface on a glass substrate is set at an irradiated surface parallel to the horizontal plane. A distance between the semiconductor film 204 and the planoconvex lens 203 is set on the order of 20 mm and fine adjusted to form the long beam 205 extending in a parallel direction to an incidence plane as much as possible on the semiconductor film 204. The fine adjustment has accuracy on the order of 50 μm. In this way, an oblong-like long bean 205 with major and minor axes respectively on the order of 500 μm and 20 mm is formed.

The substrate that has the semiconductor film 204 formed is the glass substrate with a thickness d, and is fixed to an absorption stage 207 in laser irradiation not to fall down. It is possible to move the absorption stage 207 with an uniaxial robot 208 for X axis and an uniaxial robot 209 for Y axis in X and Y directions on a parallel plane to a surface of the semiconductor film 204. Since the foregoing inequality for no interference is φ≧arctan(W/2d), φ≧19.7° is obtained when the substrate has a thickness of 0.7 mm, for example.

Next, laser oscillators 210 and 214 that outputs 30 W (Nd:YAG laser, CW, fundamental wave: 1.064 μm, TEM$_{00}$) are prepared. The laser beams have a divergence angle on the order of 3 mrad, and are made to go at an angle θ to the vertical direction into planoconvex lenses 211 and 213, respectively. The angle θ is set on the order of 40° and the planoconvex lenses 211 and 213 respectively have a focal length of 15 mm. Then, oblong-like long beams 206 and 212 with 1 mm×0.2 mm are formed. An arrangement is necessary to cover the long beam 205 with both the long beams 206 and 212.

An example of the arrangement is shown in FIG. 2B. The long beams 206 and 212 of the fundamental wave are arranged at both sides in the direction of the major axis of the long beam 205 of the second harmonic, and the major axes of the respective long beams are made in alignment. Such configuration is preferable since the fundamental waves act directly on an energy attenuation portion at the both sides of the long beam 205 of the second harmonic to supply energy for the energy attenuation. The laser beam generally has the energy distribution like Gaussian in which the center has the highest energy that becomes attenuated toward the periphery thereof. The long beam 205 of the second harmonic also has lower energy at the both sides compared to energy of the center and has an influence on the uniformity in laser annealing. Accordingly, when the fundamental wave that is more translucent to the semiconductor film is irradiated to a melted region by the long beam 205 of the second harmonic, it becomes possible to heat a region of the melted region selectively, to which the fundamental wave is irradiated.

Figure 3A:
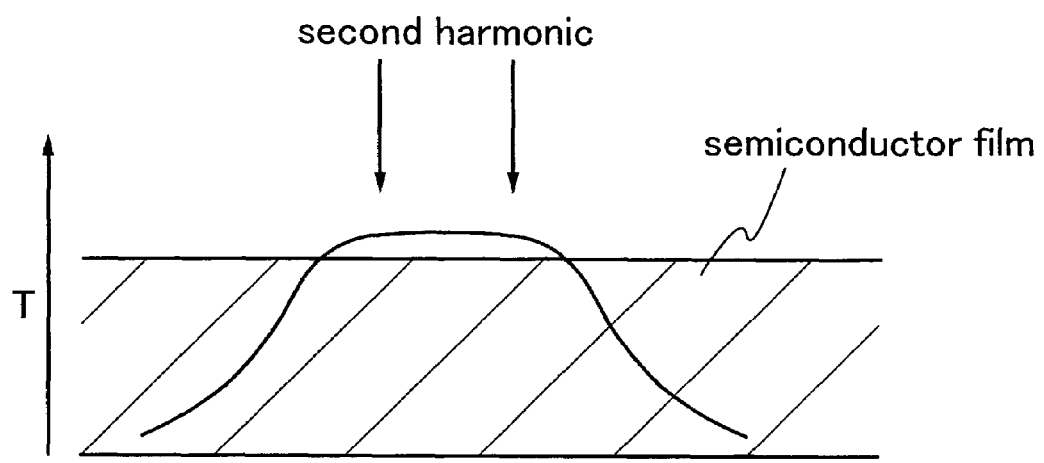
FIGS. 3A and 3B are diagrams for explaining Embodiment Mode 2.
Figure 3B:
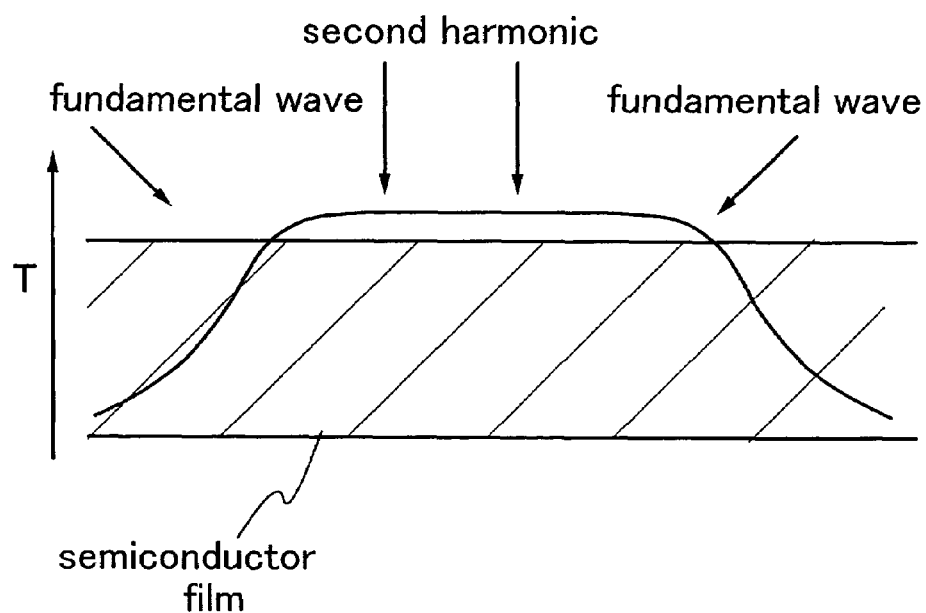

The configuration of FIG. 2B will be described in details with FIGS. 3A and 3B. In the case of performing laser annealing with only the long beam 205 of the second harmonic in a side view of FIG. 2B, the semiconductor film is heated with a temperature distribution as shown in FIG. 3A. Since a melted portion usually has better thermal conduction than a solid portion, the central portion of the long beam 205 has uniform energy distribution while the both sides thereof has energy considerably attenuated to cause lowering of the temperature. It is possible to irradiate the fundamental wave directly to the both sides since the fundamental wave has a high transmissivity with respect to the semiconductor film, and the region with the uniform temperature distribution in the semiconductor film can be more increased thereby. In other words, when the long beams 206 and 212 are irradiated to the both sides of the long beam 205 as shown in the side view of FIG. 2B, it is possible to change the temperature distribution of the semiconductor film as FIG. 3B, that is, to increase the region with the uniform temperature distribution in the semiconductor film to suppress irregularity in annealing temperature.

Next, an example of laser irradiation to the semiconductor film 204 will be described. The semiconductor film 204 is manufactured, for example, in accordance with the method mentioned in Embodiment Mode 1. Although the output of the laser oscillator 201 is up to on the order of 10 W, the energy density thereof is efficient since the size of the long beam 205 is relatively small. Therefore, the laser irradiation is performed with the output turned down on the order of 5.5 W. The output of each of the laser oscillators 210 and 214 is set on the order of 15 W and the long beams 206 and 212 are formed to cover the long beam 205 from the both sides. The long beams 206 and 212 shown in FIGS. 2A and 2B are roughly the size of the long beam 205 to be easy viewable although the minor axes of the long beams 206 and 212 are ten times as ling as the minor axis of the long beam 205 in the present embodiment mode. The size of each of the laser beams may be appropriately determined in accordance with conditions such as a film used since the gist of the present invention is consistent even though the laser beams are nearly equal in size.

The substrate with the semiconductor film 204 formed is scanned in a direction of the minor axis of the long beam 205 with the uniaxial robot 209 for Y axis to enable to form paved single-crystal grains extending long in the scanning direction in a region with a width of 200 μm in a direction of the major axis of the long beam 205. In this laser irradiation, since the long beam 205 is covered with the long beams 206 and 212, the fundamental wave is irradiated to the semiconductor film 204 first, after that, the second harmonic is irradiated, and the fundamental wave is again irradiated lastly, which makes it possible to suppress a rapid change in temperature of the semiconductor film. The laser beam with the higher harmonic has an incident angle of 20° or more, which suppresses interference to enable to more uniform laser irradiation. Although the width of the formed long crystal grain region is about 150 μm without aid of the long beams 206 and 212 of the fundamental wave, the width of the long crystal grain region is made wider to on the order of 200 μm with the aid. At both sides of the long crystal grain region in a direction of the width thereof, annealing at low temperature is still performed regardless of the expanded region with the uniform temperature distribution, and it is concerned that a semiconductor device manufactured in the both sides has characteristics degraded. Therefore, in order to avoid the degraded characteristics of the semiconductor device, the semiconductor device may not be manufactured in the both sides or scanning with the long beam may be performed with overlapping in the direction of the major axis thereof. For example, when it is assumed that there are regions with a width of 50 μm, which is concerned with the degraded characteristics, at the both sides of the long crystal grain region with the width of 200 μm, the width of the effectively usable long crystal grain region is 100 μm. There, after the semiconductor film 209 is crystallized by scanning in one direction with the uniaxial robot 209 for Y axis, the uniaxial robot 208 for X axis is moved by 100 μm and the long crystal grain region is formed again by scanning with the uniaxial robot 209 for Y axis. When such round of operation is repeated, it is possible to change the regions concerned with the degraded characteristics completely to regions with better characteristics. The semiconductor film 204 may be crystallized entirely or partially in accordance with, for example, FIG. 6 described in Embodiment Mode 1.

Embodiment Mode 3

Figure 4A:
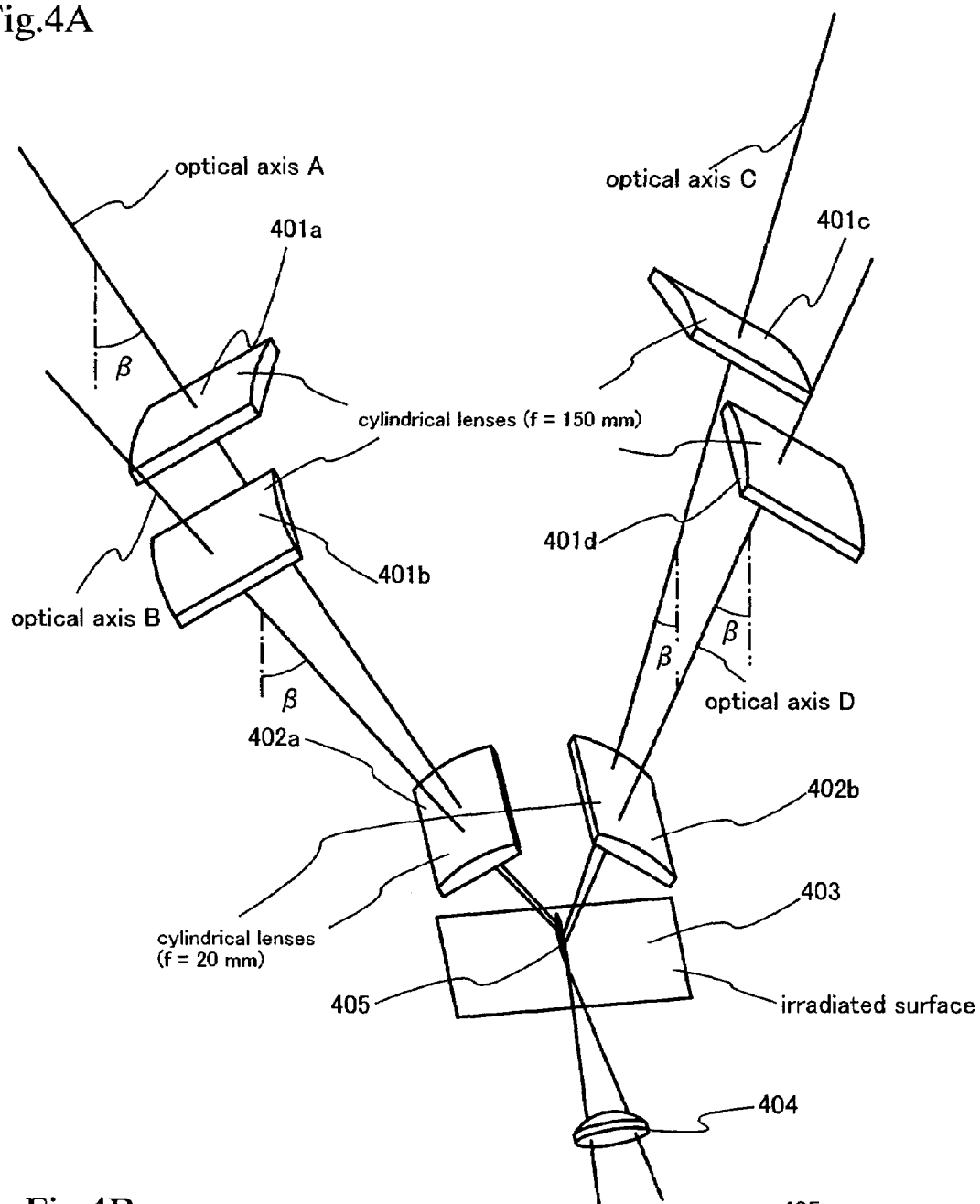
FIGS. 4A and 4B are diagrams for explaining Embodiment Mode 3.

In the present embodiment mode, an example will be described with reference to FIG. 4, in which several long beams obtained by processing the second harmonic are combined to form a longer beam and a fundamental wave is used to aid energy.

First, four laser oscillators (not shown in FIG. 4) that output 10 W with LD excitation (Nd:YVO$_4$ laser, CW, second harmonic: 532 nm) respectively are prepared. Each of the laser oscillators uses an oscillation mode of TEM$_{00}$ and has a LBO crystal incorporated in a resonator to perform conversion into second harmonic. The respective laser beams have a beam diameter of 2.25 mm and a divergence angle on the order of 0.3 mrad. Several reflecting mirrors are used in order to convert traveling directions of the laser beams respectively to have an angle β to the vertical direction, and the laser beams with the converted traveling directions are made to go to a irradiated surface 403 from four directions respectively in order to be combined into nearly one at the irradiated surface 403. The four directions are corresponded to optical axes A, B, C, and D respectively. The optical axes A and B (also the optical axes C and D) are positioned with plane symmetry to plane A that is vertical to the irradiated surface 403, and an angle made by the optical axes A and B (also an angle made by the optical axes C and D) is set at 10°. In addition, the optical axes A and C (also the optical axes B and D) are positioned with plane symmetry to plane B that is vertical to the plane A and the irradiated surface 403, and an angle made by plane C including the optical axes A and B and plane D including the optical axes C and D) is set at 50°.

Then, planoconvex cylindrical lenses 401a, 401b, 401c, and 401d that have a focal length of 150 mm are arranged in order that the optical axes A to D are made to go with an angle of 0°. On this occasion, condensing directions of the planoconvex cylindrical lenses are directions included in the plane C or plane D. A distance between the irradiated surface 403 and each of the planoconvex cylindrical lenses 401a to 401d is adjusted between 110 to 120 mm measured along the optical axis.

Further, planoconvex cylindrical lenses 402a and 402b that have a focal length of 20 mm are arranged in order that generating lines thereof are included in the planes C and D respectively. The generating line described here is defined as a generating line located at a curved portion of the cylindrical lens, which is most apart from a plane portion of the cylindrical lens. The plane portion of the planoconvex cylindrical lens 402a and the plane C are orthogonalized each other while the plane portion of the planoconvex cylindrical lens 402b and the plane D are orthogonalized each other. A distance between the irradiated surface 403 and each of the planoconvex cylindrical lenses 402a and 402b is adjusted on the order of 18 mm measured along the optical axis.

Figure 4B:
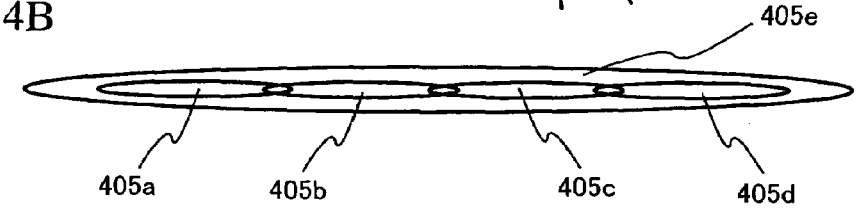

With the arrangement described above, four long beams with a size of a major axis on the order of 400 μm and a minor axis on the order of 20 μm are formed at the irradiated surface 403. In this case, the four long beams are combined into one perfectly at the irradiated surface 403 without forming a longer beam. However, when the positions of the respective lenses are fine adjusted, the arrangement of the four long beams is converted as shown in FIG. 4B. In other words, the major axes of the four long beams 405a to 405d are arranged in alignment and shifted each other in the direction of the major axes to form a longer beam. In this way, a long crystal grain region with a width of 1.5 mm can be obtained.

Then, CW-YAG laser (fundamental wave) that outputs 10 W with LD excitation is used to form an oblong beam 405e with a size of 1×5 mm at the irradiated surface 403 with an optical system 404. On this occasion, the oblong beam 405e is formed to cover the four long beams. As the optical system 404, the planoconvex lens 111 shown in FIG. 1, for example, may be used and the laser beam may be made to go into the planoconvex lens 111 obliquely at an angle thereto to form the oblong beam 405e. Alternatively, two orthogonal cylindrical lenses may be used to convert a round beam into the oblong beam. What is important here is that the fundamental wave must not be returned to the laser oscillator at all. Since the fundamental wave is reflected somewhat at a surface of a semiconductor film, only what is forbidden is that laser beam is made to go to the irradiated surface 403 vertically thereto.

Thus formed longer beam of the four long beams and the oblong beam 405e may be used to crystallize the semiconductor film entirely with, for example, the uniaxial robot 108 for X axis and the uniaxial robot 109 for Y axis shown in Embodiment Mode 1. The semiconductor film may be manufactured, for example, in accordance with the method described in Embodiment Mode 1. There are advantages due to the present embodiment mode that the longer beam makes processing time shorter and the long beams with Gaussian-like energy distribution are overlapped with each other contiguously to uniformize energy distribution in the direction of the major axis, which is preferable since it is possible to suppress the irregularity in temperature relatively.

Embodiment Mode 4

Figure 5:
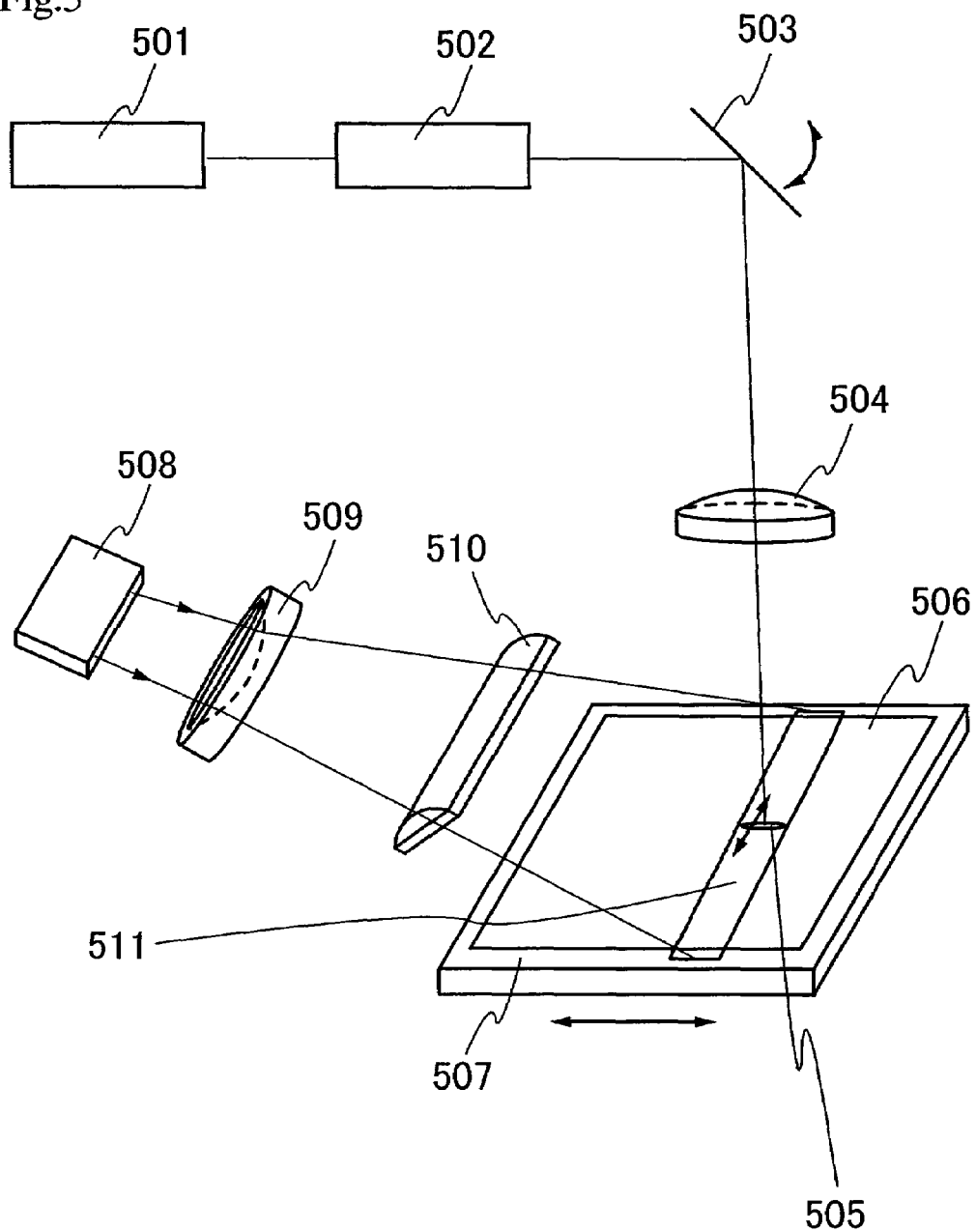
FIG. 5 is a diagram for explaining Embodiment Mode 4.

In the present embodiment mode, an example will be described with reference to FIG. 5, in which a deflection means such as a galvanometer mirror is used to perform scanning with a long beam obtained by processing the second harmonic and a fundamental wave is used to aid energy.

First, a laser oscillator 501 that outputs 10 W with LD excitation (Nd:YVO$_4$ laser, CW, second harmonic: 532 nm) is prepared. The laser oscillator 501 uses an oscillation mode of TEM$_{00}$ and has a LBO crystal incorporated in a resonator to perform conversion into second harmonic. The laser beam, which is round, has a beam diameter of 2.25 mm and a divergence angle on the order of 0.3 mrad, and is made to go into an optical system 502 to be converted into an oblong. As a conversion means, a beam expander comprising two cylindrical lenses, for example, may be used to expand the laser beam in only one direction for the oblong. Alternatively, a normal beam expander combined with the beam expander mentioned above may be used to control the divergence angle. Then, the oblong-shaped laser beam is deflected with a galvanometer mirror 503. The deflected laser beam reaches a plane formed of a semiconductor film 506 thorough an fθ lens 504. With the fθ lens 504, the oblong-shaped laser beam is condensed at the plane. In this way, a long beam with, for example, a minor axis of 20 μm and a major axis of 400 μm is formed on the plane.

When an angle of the galvanometer mirror 503 is changed, scanning with the long beam 505 is performed on the plane. The change in the shape of the long beam 505, due to the angle of the galvanometer mirror 503, is suppressed by the fθ lens 504. The laser beam has an incident angle of 20° with respect to the semiconductor film 506, which prevents interference on the semiconductor film 506 from being generated. The interference here is interference of reflected light of the laser light from the surface of the semiconductor film 506 with reflected light of the laser light from a rear surface of the substrate with the semiconductor film 506 formed. In the present embodiment mode, the galvanometer mirror 503 composed of one mirror is used and only one axis of scanning is performed, which does not enable scanning of a whole area of the two-dimensional plane. Therefore, the substrate is put on an uniaxial stage 507 and moved from side to side on paper of FIG. 5 to enable annealing of the whole area of the substrate. A scan speed of the long beam 505 is set at 100 to 2000 mm/s, preferably, on the order of 500 mm/s.

In order to irradiate the fundamental wave to the semiconductor film 506 at the same time as the long beam 505 formed of the second harmonic, YAG laser 508 that outputs 2000 W with LD excitation is used. Since the long beam 505 is moved at a relatively high speed, a precise control system is needed in order to move a beam formed of the fundamental wave in accordance with the movement of the long beam 505. Although, of course, using such control system has no problem, a whole area scanned with the galvanometer mirror 503 is covered with a long beam 511 of the fundamental wave in the present embodiment mode so that it is not necessary to move the long beam. In this way, it is possible to have nearly no probability of generating nonuniformity in laser annealing in the case of lacking synchronization. It is since the output of the fundamental wave is centuple or more as compared to the second harmonic that such large beam can be formed.

For example, when it is assumed that the semiconductor film 506 has a size of a square 125 mm on a side, the long beam 511 with a length of 125 mm and a width of 0.5 mm, for example, may be formed in the scanning direction of the galvanometer mirror 503 to cover the area of the square entirely. For forming the long beam 511, for example, a planoconvex lens 510 may be used to condense in one direction after enlarging uniformly with a concave lens 509. Alternatively, another optical system may be used to form the long beam 511. When a homogenizer is used in order to uniformize the energy distribution, it is necessary to design the homogenizer in consideration of coherency of YAG laser. For example, the homogenizer often uses a method in which a laser beam is divided and combined to make energy distribution uniform. When the method is used, it is necessary to prevent interference from being generated, for example, by adding an optical path difference not less than a coherent length of laser to each of the divided laser beams.

For laser annealing of a whole area of the semiconductor film 506, it may be repeated that the galvanometer mirror 503 is moved by half cycle, the uniaxial stage 507 is moved by a width of a long crystal grain region, and the galvanometer mirror 503 is again moved by half cycle. In the present embodiment mode, the long crystal grain region has the width on the order of 150 μm, by which the uniaxial stage 507 is shifted in order.

Embodiment Mode 5

In the present embodiment mode, manufacturing processes of a semiconductor device will be described, which includes a stage of processing of laser annealing to a portion with a structure of a laminate of a semiconductor film, a gate insulating film, and a conductive film.

First, etching into a desired shape is performed to a semiconductor film formed on a substrate in accordance with any of Embodiment Modes 1 to 4 for dividing the semiconductor film into an island-shape. In this way, a semiconductor film 703 is formed to be a main part of a TFT for a channel region and source and drain regions. As a substrate 701, a substrate such as a commercially produced no-alkali glass substrate can be used, and a base insulating film 702 including silicon nitride, silicon oxide, or silicon oxynitride is formed between the substrate 701 and the semiconductor film 703 to have a thickness from 50 to 200 nm. Further, to the semiconductor film 703, doping of an impurity element for imparting a p-type is performed in order to shift threshold voltage to a plus side, or doping of an impurity element for imparting an n-type is performed in order to shift threshold voltage to a minus side.

Next, plural insulating films for the gate insulating film are deposited on the semiconductor film 703. As a preferred example, a silicon oxide film 704 and a silicon nitride film 705 formed with high-frequency sputtering are given. As pretreatment before deposition by sputtering, a dangling bond is terminated with hydrogen to become inactive, in addition to etching of a surface of the semiconductor film 703 by oxidation treatment with aqueous solution including ozone and treatment of removing the oxide film with aqueous solution including hydrofluoric acid. After that, high-frequency sputtering is performed with a target of silicon (doping of B for 1 to 10 Ωcm) to form the silicon oxide film 704 with a thickness from 10 to 60 nm. Typical conditions for the deposition include using $O_2$ and Ar as sputtering gas and setting the mixing ratio (flow rate ration) at 1:3. Also, at sputtering, pressure is set at 0.4 Pa, discharge electric power at 4.1 W/cm$^2$(13.56 MHz), and substrate heating temperature at 200° C. Under such conditions, it is possible to form the dense silicon oxide film 704 that is low in interface state density between the semiconductor film 703 and the silicon oxide film 704. Further, before the deposition of the silicon oxide film, heat treatment under reduced pressure or surface treatment such as oxygen plasma treatment may be performed in a spare heating chamber. When the oxygen plasma treatment is performed to oxidize the surface of the semiconductor film, the interface state density can be reduced. Then, high-frequency sputtering is to form the silicon nitride film 705 with a thickness from 10 to 30 nm. Typical conditions for the deposition include using $N_2$ and Ar as sputtering gas and setting the mixing ratio (flow rate ration) at 1:1. Also, at sputtering, pressure is set at 0.8 Pa, discharge electric power at 4.1 W/cm$^2$ (13.56 MHz), and substrate heating temperature at 200° C.

Since, in the insulating film with the laminated structure, silicon nitride has a relative dielectric constant of about 7.5 with respect to a relative dielectric constant 3.8 of silicon oxide, it is possible to obtain an effect that is substantially equivalent to the case of a thinned insulating film. When a concavo-convex shape has a maximal value of 10 nm or less, preferably 5 nm or less, concerning the smoothness of the surface of the semiconductor film, and the gate insulating film has the two-layer structure of the silicon oxide film and the silicon nitride film, it is possible to reduce gate leakage current and drive a TFT at 2.5 to 10 V, typically at 3.0 to 5.5 V, even if the gate insulating film has a total thickness from 30 to 80 nm.

After forming the laminate of the silicon oxide film 704 and the silicon nitride film 705, a first conductive film 706 is formed. A material of the first conductive film 706 is selected from high melting point metal such as molybdenum (Mo), tungsten (W), and titanium (Ti), metal nitride such as titanium nitride, tantalum nitride, and tungsten nitride, silicide such as tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), and platinum silicide ($PtSi_2$), polysilicon to which doping of phosphorous or boron is performed, and the like. The first conductive film 706 has a thickness from 10 to 100 nm, preferably from 20 to 50 nm.

Figure 7A:
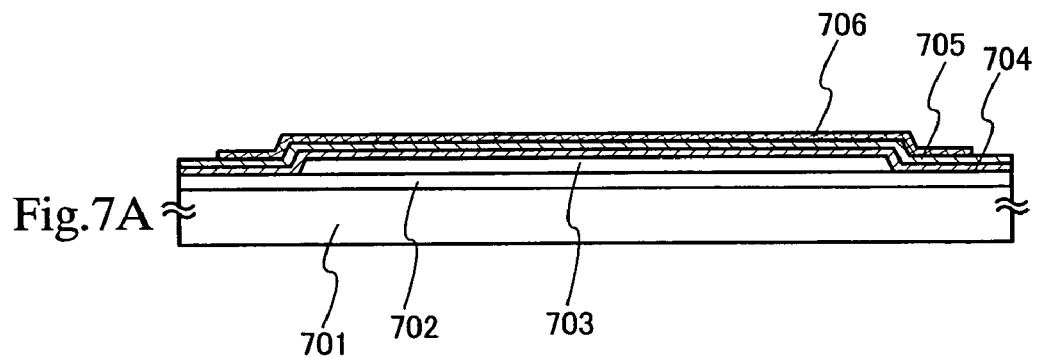
FIGS. 7A to 7C are diagrams showing a manufacturing method of a semiconductor device according to an embodiment mode of the present invention.
Figure 7B:
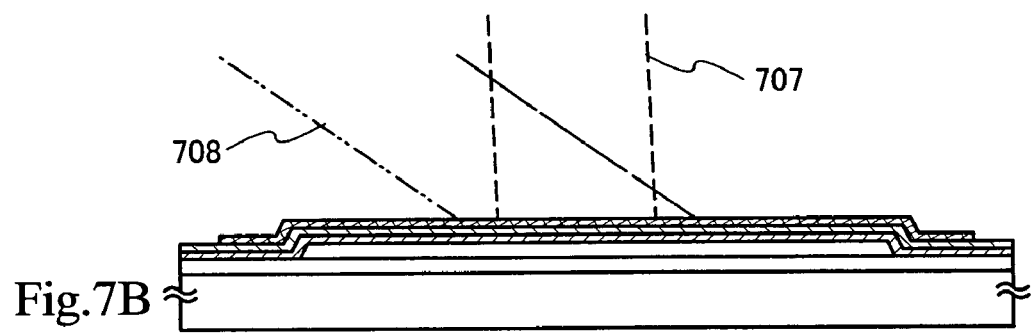

Then, as shown in FIG. 7B, irradiation of laser light 707 and laser light 708 is performed to a portion of the first conductive film 706 to heat the portion thereof. The laser light 708 has a different incident angle from that of the laser light 707 with respect to the surface of the substrate. It is possible to apply the method of irradiating laser light and the laser irradiation system, for example, shown in Embodiment Mode 1, to the present embodiment mode. In other words, the second harmonic (Nd:YVO$_4$ laser, CW, 532 nm) from the light source of the laser oscillator that outputs 10 W with LD excitation is used as the laser light 707 and the fundamental wave (Nd:YAG laser, CW, 1.064 μm, TEM$_{00}$) from the light source of the laser oscillator that outputs 30 W is used as the laser light 708. The first conductive film 706 absorbs energy of the laser light 707 and the laser light 708 to generate heat, and the silicon nitride film 705, the silicon oxide film 704, and the semiconductor film 703 below the first conductive film 706 are heated due to conduction heating. With this local treatment, it is possible to oxidize or nitride a minute silicon cluster included in the film and also relax distortion inside to reduce a defect density in the film and an interface state density.

Figure 7C:
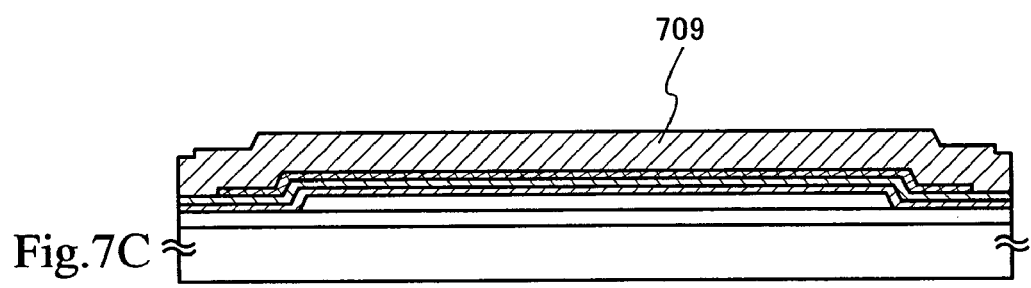

After that, as shown in FIG. 7C, an element selected form tantalum (Ta), tungsten (W), titanium (Ti), molybdenum (Mo), aluminum (Al), and copper (Cu), or an alloy or a compound containing the metal element above as its main component is deposited as a second conductive film 709. A gate electrode is formed by processing the first and second conductive films 706 and 709, and it is preferred that the first conductive film 706 formed of a tantalum nitride (TaN) film is combined with the second conductive film 709 formed of a tungsten (W) film or the first conductive film 706 formed of a tantalum nitride (TaN) film is combined with the second conductive film 709 formed of a titanium (Ti) film.

Figure 8A:
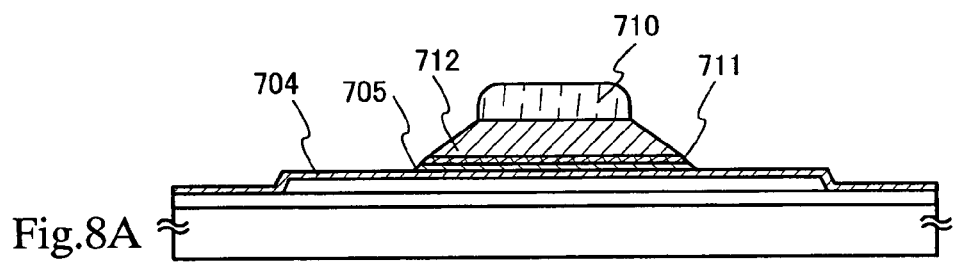
FIGS. 8A to 8E are diagrams showing the manufacturing method of the semiconductor device according to the embodiment mode of the present invention.

Next, as shown in FIG. 8A, a resist mask 710 is provided for forming a pattern of the gate electrode and a first etching is performed with dry etching. ICP (Inductively Coupled Plasma) etching, for example, may be applied to the first etching. Although there is no limit on etching gas, etching gas used for tungsten (W) and tantalum nitride (TaN) of the gate electrode in the present embodiment mode has $CF_4$, $Cl_2$, and $O_2$. In the first etching, a predetermined bias voltage is applied to the substrate to make side faces of first patterns (711 and 712) for the gate electrode have a tilt angle from 15 to 50 degree. With the first etching, depending on etching conditions, the silicon nitride film 705 formed as the gate insulating film is left below the first pattern for the gate electrode to expose the silicon oxide film 704.

Figure 8B:
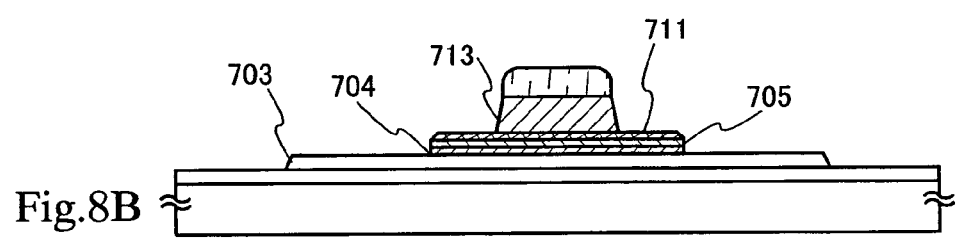

After that, a second etching is performed, and specifically, etching gas of $SF_6$, $Cl_2$, and $O_2$ is used and a bias voltage applied to the substrate side is set at a predetermined value to perform anisotropic etching of the tungsten (W) film. In this way, the gate electrode composed of the two-layer structure of first and second conductive layers 711 and 713 is formed (FIG. 8B).

Figure 8C:
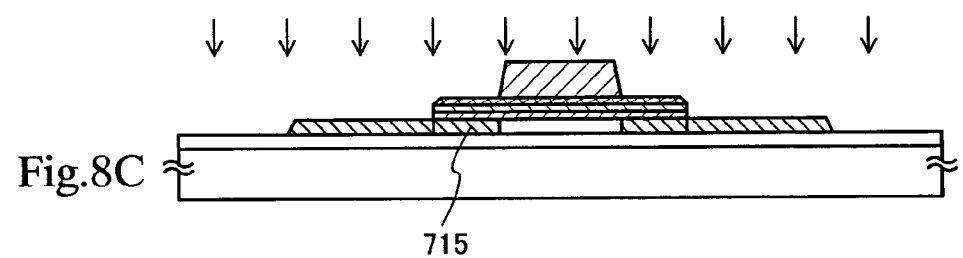
Figure 8D:
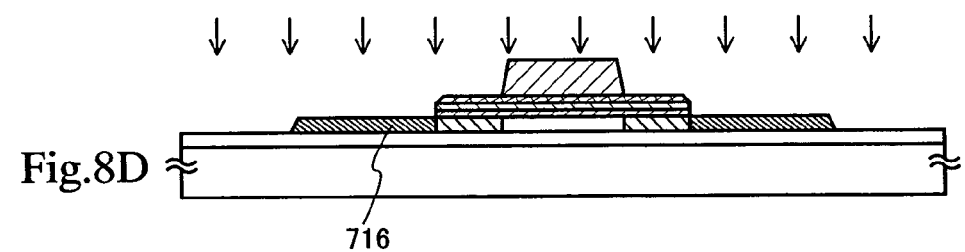

The gate electrode in the present embodiment has a laminated structure of the first and second conductive layers 711 and 713, and has a structure (top-hat type) in which the first conductive layer protrudes like a peak when the gate electrode is shown in section. Then, doping is performed as shown in FIG. 8C. In doping that an impurity ion for controlling a valence electron is accelerated with electric field for implantation, it is also possible to vary a concentration of an impurity region formed in the semiconductor layer 703 when ion accelerating voltage is appropriately adjusted, that is, the impurity ion with one conductivity type is implanted with a high accelerating voltage in order to pass thorough the peak of the first conductive layer 711 to form a first impurity region 715 overlapping with the gate electrode and then the impurity ion with the conductivity type is implanted with a low accelerating voltage in order not to pass thorough the peak of the first conductive layer 711 to form a second impurity region 716 as shown in FIG. 8D. With such doping, it is possible to form a TFT with a so-called gate overlapped LDD structure.

As the impurity with the conductivity type, an element such as phosphorous or arsenic, belonging to Group 15 in the periodic table, is used in the case of an n-type impurity (donor), and an element such as boron, belonging to Group 13 in the periodic table, is used in the case of a p-type impurity (accepter). When the impurity is selected appropriately, it is possible to manufacture an n-channel TFT or a p-channel TFT. Further, it is possible to form an n-channel TFT and a p-channel TFT both on the same substrate only by adding a mask pattern for doping.

Figure 8E:
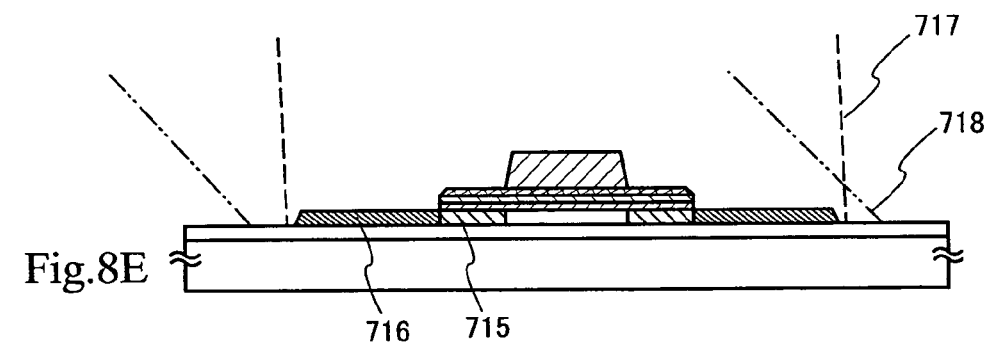

In order to activate the second impurity region 716 formed for a source and a drain and the first impurity region 715 formed for an LDD, irradiation of laser light 717 and laser light 718 is performed to the semiconductor layer 703 in which the first and second impurity regions 715 and 716 are formed (FIG. 8E). The laser light 718 has a different incident angle from that of the laser light 717 with respect to the surface of the substrate. It is possible to apply the method of irradiating laser light and the laser irradiation system, for example, shown in Embodiment Mode 1, to the present embodiment mode. In other words, the second harmonic (Nd:YVO$_4$ laser, CW, 532 nm) from the light source of the laser oscillator that outputs 10 W with LD excitation is used as the laser light 717 and the fundamental wave (Nd:YAG laser, CW, 1.064 μm, TEM$_{00}$) from the light source of the laser oscillator that outputs 30 W is used as the laser light 718. In the activation, the laser light heats the first conductive layer 711 forming the gate electrode, and due to conduction heating from there, a non-crystallized region is recrystallized and/or a defect due to the implantation is repaired. Thereby, it is possible to activate the impurity in the first impurity region 715 to which the laser light is not irradiated directly.

Figure 9A:
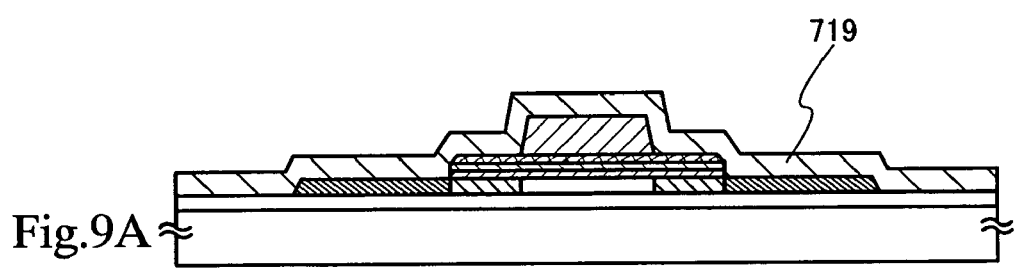
FIGS. 9A and 9B are diagrams showing the manufacturing method of the semiconductor device according to the embodiment mode of the present invention.

Then, as shown in FIG. 9A, mixed gas of SiH$_4$, N$_2$O, NH$_3$, and H$_2$ is used to form a silicon oxynitride film including hydrogen as a first insulating layer 719 with plasma CVD at a substrate heating temperature of 325° C., which has a film thickness from 50 to 200 nm. After that, heat treatment at 410° C. in a nitrogen atmosphere is performed for hydrogenation of the semiconductor layer.

Figure 9B:
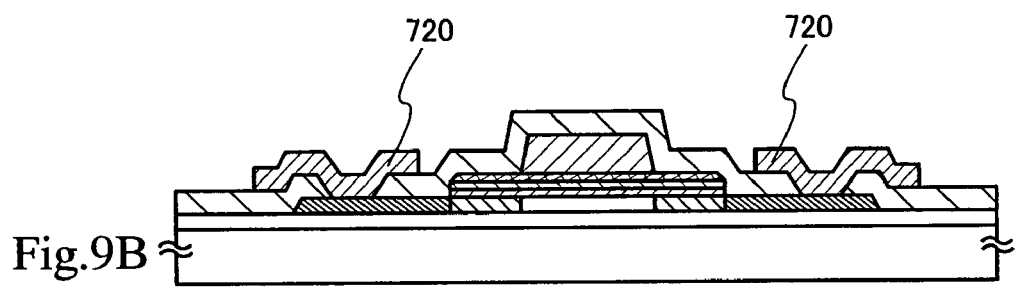

After that, a contact hole is formed in the first insulating layer 719 and metal such as Al, Ti, Mo, or W is used to form a wiring 720 appropriately, which has a wiring structure, as an example, of a laminate film of a Ti film with a film thickness from 50 to 250 nm and an alloy film (Al and Ti) with a film thickness from 300 to 500 nm (FIG. 9B).

In this way, the TFT with the gate overlapped LDD structure is completed. When high-frequency sputtering with the target of silicon is performed to manufacture the laminate of the silicon oxide film and the silicon nitride film and the laminate is applied to the gate insulating film of the TFT after the heat treatment of heating locally with the conductive layer after pattern formation, it is possible to obtain the TFT that has less fluctuation in the threshold voltage and the subthreshold characteristic.

According to the present invention, it is possible to provide a method of irradiating laser and a laser irradiation system for correcting the irregularity in irradiation, enabling uniform laser treatment, and obtaining high throughput, applied to the crystallization of the semiconductor film, the heat treatment of the gate insulating film, and the activation of the impurity region as shown in the present embodiment mode, and thereby, it is possible to provide a semiconductor device that has various functional circuits integrated using a TFT without generating a contraction or a distortion of a glass substrate. In particular, since no contraction of the glass substrate is generated, the dimensional precision around the gate electrode is kept and it is possible to form a TFT with a channel length from 0.3 to 1.5 μm on the glass substrate.

It is noted that, although the present embodiment mode shows the case of applying the method of irradiating laser and the laser irradiation system exemplified in Embodiment Mode 1, a manufacturing process of a semiconductor device according to the present invention is not limited to the case and it is also possible to apply the method of irradiating laser and the laser irradiation system exemplified in any of Embodiment Modes 2 to 4.

Embodiment Mode 6

Figure 10A:
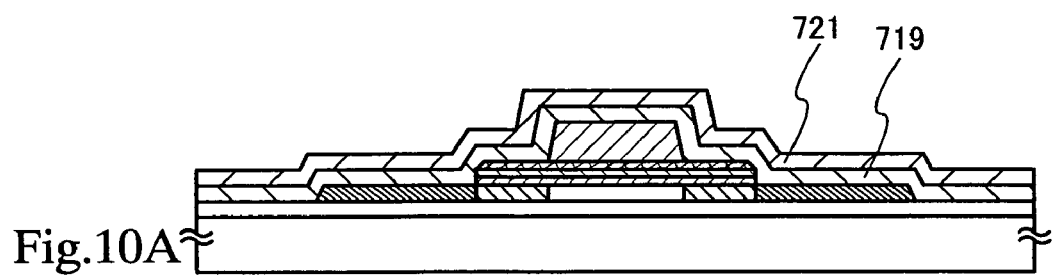
FIGS. 10A and 10B are diagrams showing a manufacturing method of a semiconductor device according to an embodiment mode of the present invention.
Figure 10B:
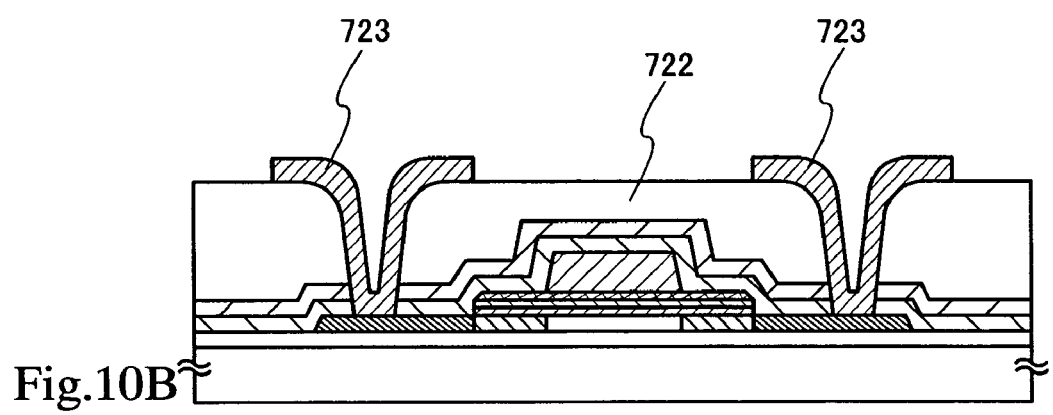

Similarly to Embodiment Mode 5, the processes up to the hydrogenation are performed to obtain the state shown in FIG. 9A. After that, high-frequency sputtering is performed with a target of silicon to form a silicon nitride film as a second insulating layer 721 on the first insulating layer 719 as shown in FIG. 10A. The silicon nitride film has a superior property as a barrier, and it is possible to obtain a blocking function of preventing penetration of an ionic impurity such as sodium as well as oxygen and moisture in the air.

Further, a photosensitive or nonphotosensitive organic resin material containing a material such as acrylic or polyimide as its main component is used to form a third insulating layer 722. A wiring 723 formed of a conductive material such as Al, Ti, Mo, or W is provided to correspond to a contact hole formed in the first to third insulating layers. When the organic resin material is used to form the third insulating layer 722, capacitance between wirings is reduced and the surface has smoothness. Therefore, it is possible to realize providing wirings on the third insulating layer with high density.

Embodiment Mode 7

In the present embodiment mode, an explanation will be given on a method of manufacturing a TFT with a gate overlapped LDD structure in accordance with different processes from Embodiment Mode 5. It is noted that the reference number that indicates the same part as that in Embodiment Mode 5 is used in common in the present mode described below and the explanation on the parts indicated by the common reference numbers will be omitted.

First, similarly to Embodiment Mode 5, the base insulating film 702, the semiconductor film 703, the silicon oxide film 704, the silicon nitride film 705, the first conductive film 706, and the second conductive film 709 are formed in order on the substrate 701, that is, the processes up to the formation of the second conductive film 709 are performed to obtain the state shown in FIG. 7C.

Figure 11A:
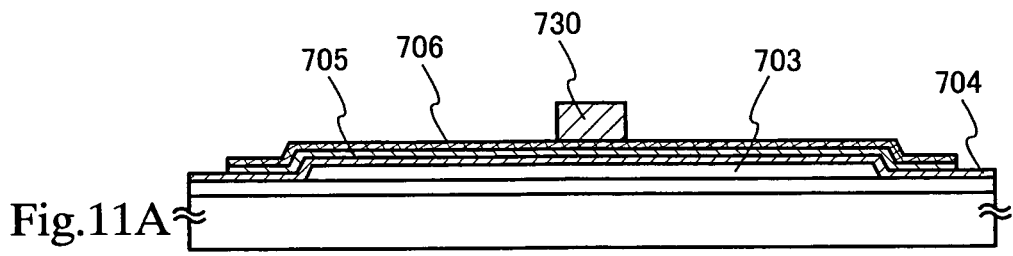
FIGS. 11A to 11E are diagrams showing a manufacturing method of a semiconductor device according to an embodiment mode of the present invention.
Figure 11B:
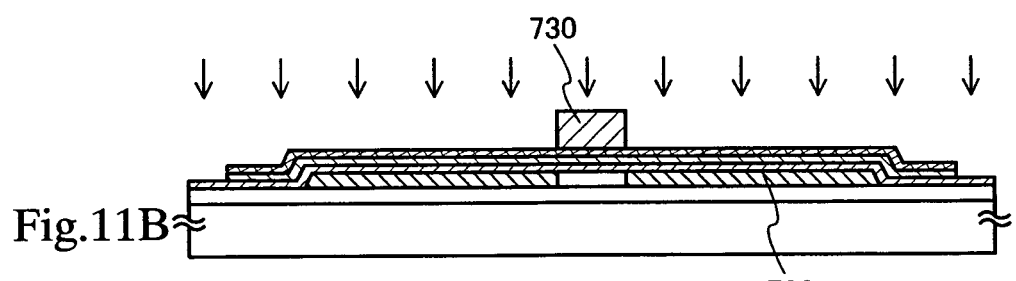

Next, as shown in FIG. 11A, a second conductive layer 730 on the first conductive film 706 is formed by etching in accordance with a pattern of a gate electrode. Then, the second conductive layer 730 is used as a mask, and doping of an impurity with one conductivity type is performed. The impurity with the conductivity type is made to pass through the first conductive film 706 and implanted into the semiconductor film 703 to form a first impurity region 732 (FIG. 11B).

Figure 11C:
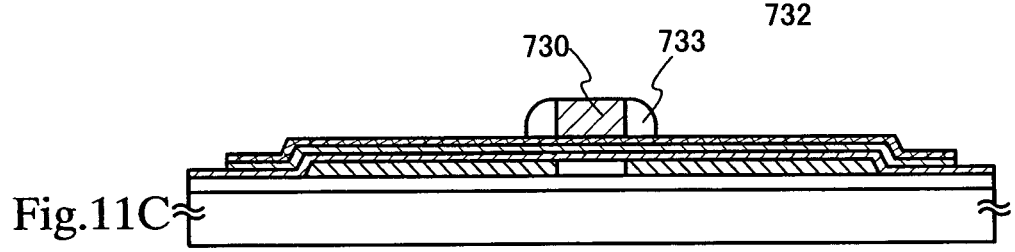
Figure 11D:
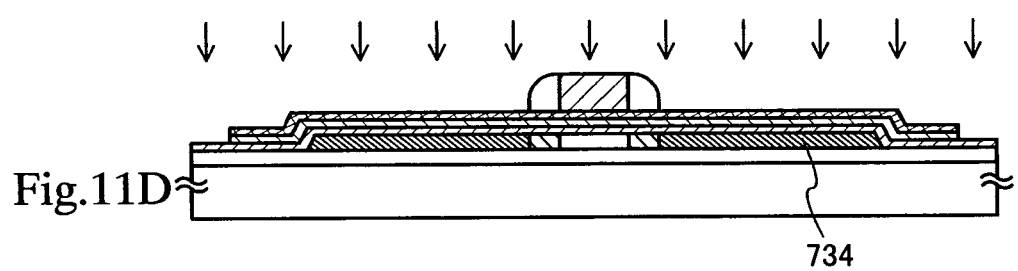

Next, an insulating film such as a silicon oxide film is formed on the first conductive film 706 and the second conductive layer 730, and anisotropic etching is performed to form a side spacer 733 (FIG. 11C). The side spacer 733 and the second conductive layer 730 are used as a mask for doping, and a second impurity region 734, to which doping of the impurity with the conductivity type is performed through the first conductive film 706, is formed with self-aligning (FIG. 11D).

As the impurity with the conductivity type, an element such as phosphorous or arsenic, belonging to Group 15 in the periodic table, is used in the case of an n-type impurity (donor), and an element such as boron, belonging to Group 13 in the periodic table, is used in the case of a p-type impurity (accepter). When the impurity is selected appropriately, it is possible to manufacture an n-channel TFT or a p-channel TFT. Further, it is possible to form an n-channel TFT and a p-channel TFT both on the same substrate only by adding a mask pattern for doping.

Figure 11E:
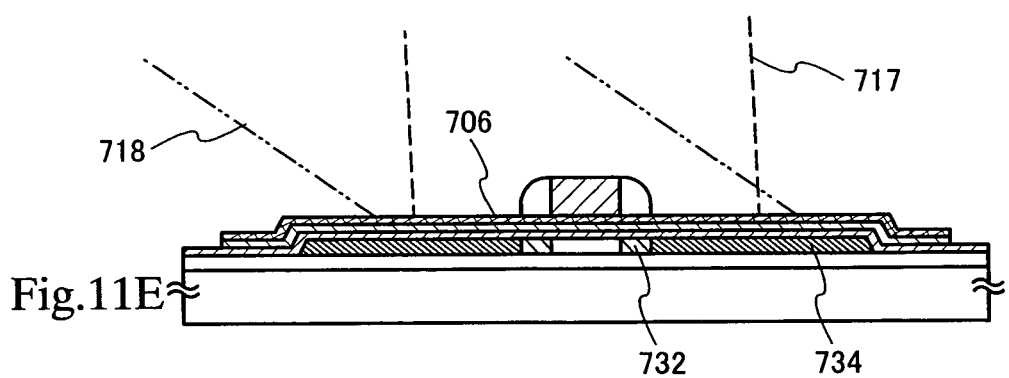

In order to activate the second impurity region 734 formed for a source and a drain and the first impurity region 732 formed for an LDD, as shown in FIG. 11E, irradiation of laser light 717 and laser light 718 is performed to the semiconductor layer 703 in which the first and second impurity regions 732 and 734 are formed. The laser light 718 has a different incident angle from that of the laser light 717 with respect to the surface of the substrate. It is possible to apply the method of irradiating laser light and the laser irradiation system, for example, shown in Embodiment Mode 1, to the present embodiment mode. In other words, the second harmonic (Nd:YVO$_4$ laser, CW, 532 nm) from the light source of the laser oscillator that outputs 10 W with LD excitation is used as the laser light 717 and the fundamental wave (Nd:YAG laser, CW, 1.064 μm, TEM$_{00}$) from the light source of the laser oscillator that outputs 30 W is used as the laser light 718.

Figure 12A:
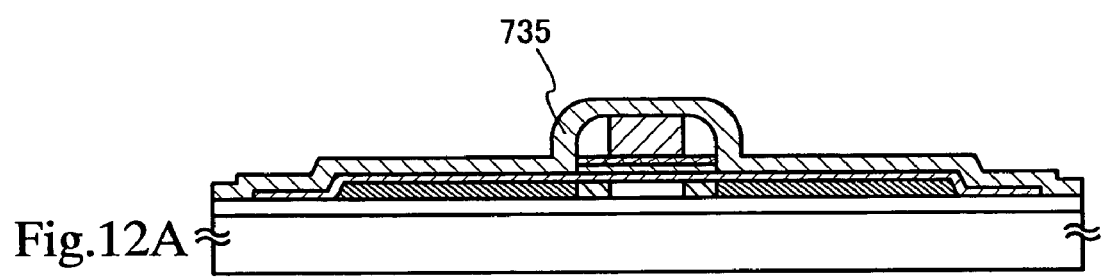
FIGS. 12A and 12B are diagrams showing the manufacturing method of the semiconductor device according to the embodiment mode of the present invention.

After that, the second conductive layer 730 and the side spacer 733 are used as a mask, and etching of the first conductive film 706 is performed. Then, mixed gas of SiH$_4$, N$_2$O, NH$_3$, and H$_2$ is used to form a silicon oxynitride film including hydrogen as a first insulating layer 735 with plasma CVD at a substrate heating temperature from 250 to 350° C., which has a film thickness from 50 to 200 nm. After forming the first insulating layer 735, heat treatment at 410° C. in a nitrogen atmosphere is performed for hydrogenation of the semiconductor layer (FIG. 12A).

Figure 12B:
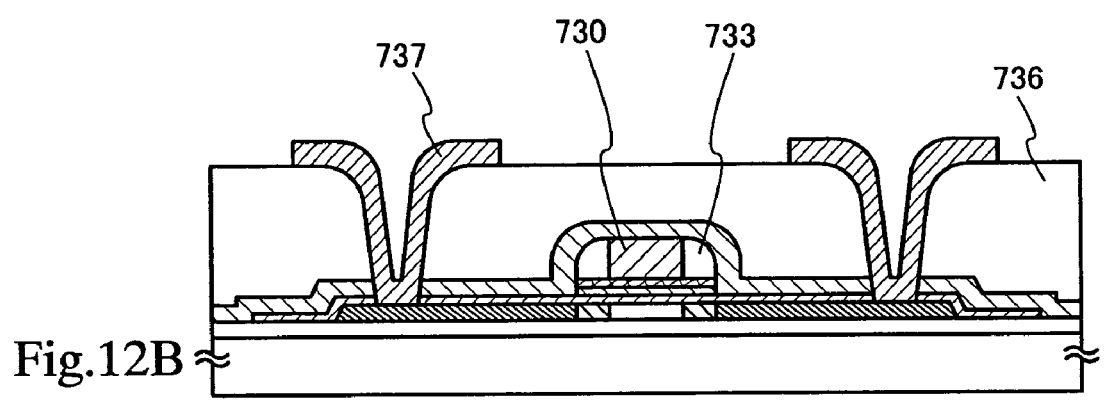

Further, a photosensitive or nonphotosensitive organic resin material containing a material such as acrylic or polyimide as its main component is used to form a second insulating layer 736. A wiring 737 formed of a conductive material such as Al, Ti, Mo, or W is provided to correspond to a contact hole formed in the first and second insulating layers. When the organic resin material is used to form the third insulating layer 736, capacitance between wirings is reduced and the surface has smoothness. Therefore, it is possible to realize providing wirings on the second insulating layer with high density (FIG. 12B).

In this way, the TFT with the gate overlapped LDD structure is completed. According to the present invention, it is possible to provide a method of irradiating laser and a laser irradiation system for correcting the irregularity in irradiation, enabling uniform laser treatment, and obtaining high throughput, applied to the crystallization of the semiconductor film, the heat treatment of the gate insulating film, and the activation of the impurity region as shown in the present embodiment mode, and thereby, it is possible to provide a semiconductor device that has various functional circuits integrated using a TFT without generating a contraction or a distortion of a glass substrate. In particular, since no contraction of the glass substrate is generated, the dimensional precision around the gate electrode is kept and it is possible to form a TFT with a channel length from 0.3 to 1.5 μm on the glass substrate.

It is noted that, although the present embodiment mode shows the case of applying the method of irradiating laser and the laser irradiation system exemplified in Embodiment Mode 1, a manufacturing process of a semiconductor device according to the present invention is not limited to the case and it is also possible to apply the method of irradiating laser and the laser irradiation system exemplified in any of Embodiment Modes 2 to 4.

Embodiment Mode 8

In the present embodiment mode, an explanation will be given on a method of manufacturing a TFT with a gate overlapped LDD structure in accordance with different processes from Embodiment Modes 5 to 7. It is noted that the reference number that indicates the same part as that in Embodiment Mode 5 is used in common in the description below and the explanation on the parts indicated by the common reference numbers will be omitted for the sake of convenience.

In FIG. 13A, the base insulating film 702 and the semiconductor film 703 are formed in the substrate 701. After a mask 740 is formed thereon, doping is performed to form a first impurity region 741.

After the mask 740 is stripped off and an organic contamination is removed by cycle cleaning that uses ozone water and hydrofluoric acid alternately or UV (ultraviolet rays) ozone treatment to form a clean surface, the silicon oxide film 704, the silicon nitride film 705, and the first conductive film 706 are formed (FIG. 13B).

After that, the second conductive film 709 is formed (FIG. 13C). Then, etching is performed to form a second conductive layer 742 processed to have a pattern of a gate electrode. The gate electrode is formed to correspond to the position where the mask 740 is formed and overlapped with the first impurity region 741 to form the gate overlapped structure at this stage (FIG. 13D).

Figure 14A:
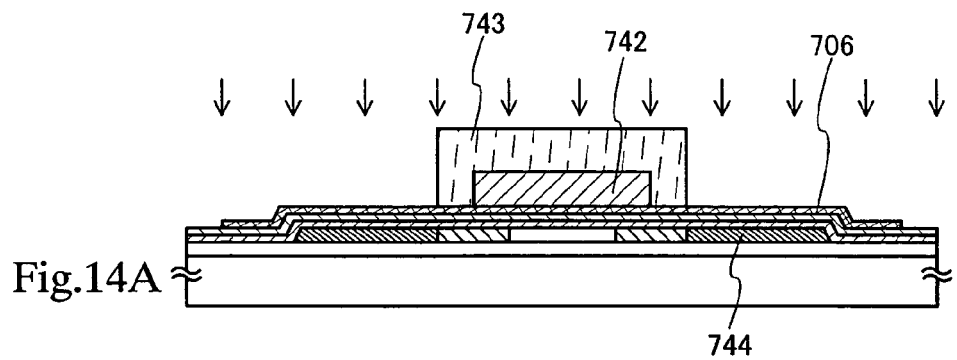
FIGS. 14A to 14C are diagrams showing the manufacturing method of the semiconductor device according to the embodiment mode of the present invention.

Next, a mask 743 is formed on the second conductive layer 742 as shown in FIG. 14A. The second conductive layer 742 is covered with the mask 743 also formed on the semiconductor film 703 for an LDD region that is not overlapped with the gate electrode. With this state, doping is performed with using the mask 743 to form a second impurity region 744.

Figure 14B:
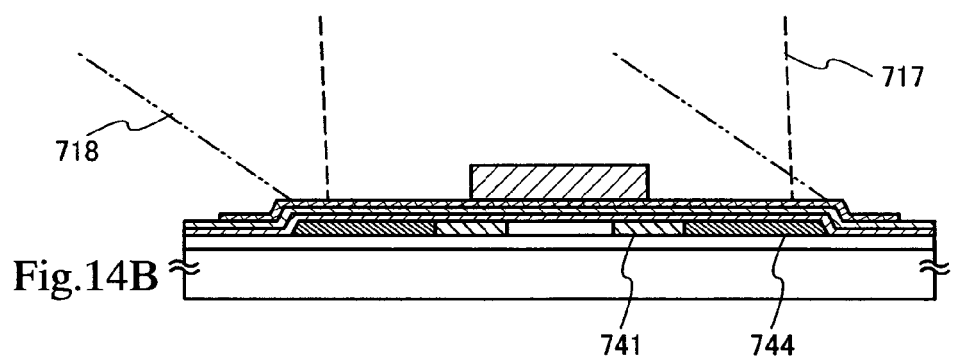
Figure 14C:
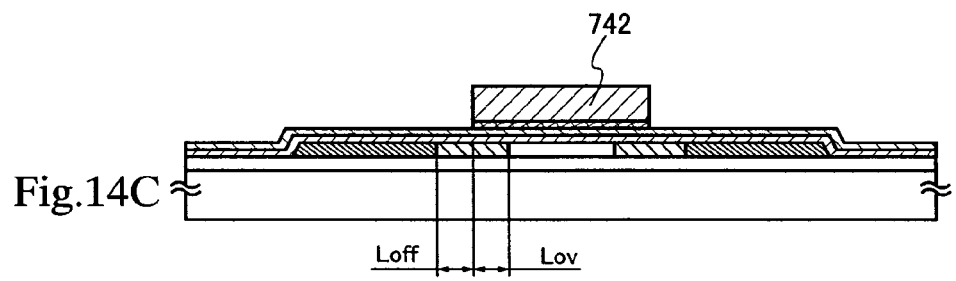

After that, heat treatment is performed in a similar way to Embodiment Mode 5 in order to activate the first and the second impurity regions 741 and 744 and modify the gate insulating film (FIG. 14B), that is, irradiation of laser light 717 and laser light 718 is performed to the semiconductor layer 703 in which the first and second impurity regions 741 and 744 are formed. The laser light 718 has a different incident angle from that of the laser light 717 with respect to the surface of the substrate. It is possible to apply the method of irradiating laser light and the laser irradiation system, for example, shown in Embodiment Mode 1, to the present embodiment mode. In other words, the second harmonic (Nd:YVO$_4$ laser, CW, 532 nm) from the light source of the laser oscillator that outputs 10 W with LD excitation is used as the laser light 717 and the fundamental wave (Nd:YAG laser, CW, 1.064 μm, TEM$_{00}$) from the light source of the laser oscillator that outputs 30 W is used as the laser light 718.

In the present embodiment mode, it is possible to activate the first and second impurity regions and modify the gate insulating film at the same time. Then, when etching is performed to the first conductive film 706, it is possible to complete a TFT in which a portion (Lov) of the LDD region is overlapped with the gate electrode and the other (loff) is not overlapped.

It is noted that, although the present embodiment mode shows the case of applying the method of irradiating laser and the laser irradiation system exemplified in Embodiment Mode 1, a manufacturing process of a semiconductor device according to the present invention is not limited to the case and it is also possible to apply the method of irradiating laser and the laser irradiation system exemplified in any of Embodiment Modes 2 to 4.

Embodiment Mode 9

In the present embodiment mode, an example will be described on a manufacturing method of a semiconductor device including a TFT with a bottom-gate (inverted-staggered) structure.

In FIG. 15A, the base insulating film 702 is formed on the substrate 701. In order to form a gate electrode 761, a metal of elements such as titanium, molybdenum, chromium, and tungsten or an alloy including the metal above is used. For example, an alloy of molybdenum and aluminum is used.

Alternatively, the gate electrode 761 may be formed of aluminum and a surface thereof may be anodized for stabilization.

Thereon, the silicon nitride film 705 and the silicon oxide film 704 as a gate insulating film are formed in this order with high-frequency sputtering. The semiconductor film 703 is formed in a similar way to any of Embodiment Mode 1 to 4.

Then, with this state, irradiation of laser light 762 and laser light 763 may be performed for heat treatment of the gate insulating film, as shown in FIG. 15B. The laser light 762 has a different incident angle from that of the laser light 763 with respect to the surface of the substrate. It is possible to apply the method of irradiating laser light and the laser irradiation system, for example, shown in Embodiment Mode 1, to the present embodiment mode. In other words, the second harmonic (Nd:YVO$_4$ laser, CW, 532 nm) from the light source of the laser oscillator that outputs 10 W with LD excitation is used as the laser light 762 and the fundamental wave (Nd:YAG laser, CW, 1.064 µm, TEM$_{00}$) from the light source of the laser oscillator that outputs 30 W is used as the laser light 763. The gate electrode 761 absorbs energy of the laser light 762 and the laser light 763 to generate heat, and the silicon nitride film 705, the silicon oxide film 704, and the semiconductor film 703 above the gate electrode 761 are heated due to conduction heating. With this local treatment, it is possible to oxidize or nitride a minute silicon cluster included in the film and also relax distortion inside to reduce a defect density in the film and an interface state density.

Next, a channel protective film 764 such as a silicon oxide film is formed on the semiconductor film 703, and is used as a mask to form an impurity region with one conductivity type. FIG. 15C shows the case of forming an impurity region 765 for a source and a drain. Besides, not shown in the figure, doping may be performed twice to add another impurity region for LDD. As the impurity with the conductivity type, an element such as phosphorous or arsenic, belonging to Group 15 in the periodic table, is used in the case of an n-type impurity (donor), and an element such as boron, belonging to Group 13 in the periodic table, is used in the case of a p-type impurity (accepter). When the impurity is selected appropriately, it is possible to manufacture an n-channel TFT or a p-channel TFT. Further, it is possible to form an n-channel TFT and a p-channel TFT both on the same substrate only by adding a mask pattern for doping.

In order to activate the impurity region 765 formed for a source and a drain, irradiation of laser light 762 and laser light 763 is performed to the semiconductor film 703 in which the impurity regions 765 is formed. The laser light 762 has a different incident angle from that of the laser light 763 with respect to the surface of the substrate. It is possible to apply the method of irradiating laser light and the laser irradiation system, for example, shown in Embodiment Mode 1, to the present embodiment mode. In other words, the second harmonic (Nd:YVO$_4$ laser, CW, 532 nm) from the light source of the laser oscillator that outputs 10 W with LD excitation is used as the laser light 762 and the fundamental wave (Nd:YAG laser, CW, 1.064 µm, TEM$_{00}$) from the light source of the laser oscillator that outputs 30 W is used as the laser light 763.

Then, as shown in FIG. 15E, mixed gas of SiH$_4$, N$_2$O, NH$_3$, and H$_2$ is used to form a silicon oxynitride film including hydrogen as a first insulating layer 766 with plasma CVD at a substrate heating temperature of 325° C., which has a film thickness from 50 to 200 nm. After that, heat treatment at 410° C. in a nitrogen atmosphere is performed for hydrogenation of the semiconductor layer.

Further, a photosensitive or nonphotosensitive organic resin material containing a material such as acrylic or polyimide as its main component is used to form a second insulating layer 767. A wiring 768 formed of a conductive material such as Al, Ti, Mo, or W is provided to correspond to a contact hole formed in the first and second insulating layers. When the organic resin material is used to form the second insulating layer 767, capacitance between wirings is reduced and the surface has smoothness. Therefore, it is possible to realize providing wirings on the second insulating layer with high density.

In this way, the bottom-gate type (inverted-staggered type) TFT can be completed. When high-frequency sputtering is performed with the target of silicon to manufacture the laminate of the silicon oxide film and the silicon nitride film and the laminate is applied to the gate insulating film of the TFT after the heat treatment of heating locally with the conductive layer after pattern formation, it is possible to obtain the TFT that has less fluctuation in the threshold voltage and the sub-threshold characteristic.

Embodiment Mode 10

In Embodiment Modes 1 to 9, it is exemplified to irradiate laser light to the a-Si film for crystallization. The present invention, however, is not limited to such application, and for example, is also applicable to treatment for improving and modifying crystallinity of a crystallized semiconductor film, using a method of irradiating laser and a laser irradiation system according to the present invention.

First, as shown in FIG. 16A, the base insulating film 702, composed of an insulating film such as a silicon oxide film, a silicon nitride film, or a silicon oxynitride film, is formed on the substrate 701. Specifically, reaction gas of SiH$_4$, NH$_3$, and N$_2$O is used to form a first silicon oxynitride film containing nitrogen more than or nearly equal to oxygen with plasma CVD at a substrate heating temperature of 400° C. and reaction gas of SiH$_4$ and N$_2$O is used to form a second silicon oxynitride film containing oxygen more than nitrogen with plasma CVD at a substrate heating temperature of 400° C., to form the base insulating film 702 of a laminated structure of the first and second silicon oxynitride films.

In the laminated structure, the first oxynitride film may be substituted with a silicon nitride film formed with high-frequency sputtering. The silicon nitride film can prevent diffusion of a small amount of alkali metal such as sodium (Na) included in a glass substrate.

A semiconductor layer for forming channel, source, and drain portions of a TFT is obtained by crystallizing an amorphous silicon film 751 formed on the base insulating film 702. The amorphous silicon film 751 formed with plasma CVD at a substrate heating temperature of 300° C. has a thickness from 20 to 60 nm. For the semiconductor layer, an amorphous silicon-germanium (Si$_{1-x}$Ge$_x$; x=0.001 to 0.05) film may be applied in stead of the amorphous silicon film.

In order to perform crystallization, a metal element such as nickel (Ni), which has a catalytic action to crystallization of a semiconductor, is added. In FIG. 16A, heat treatment due to radiation heating or conduction heating is performed for crystallization after a nickel (Ni) containing layer 752 is kept on the amorphous silicon film 751. For example, RTA (Rapid Thermal Annealing) with radiation of a lamp as a heat source or RTA (gas RTA) with heated gas is performed at a present heating temperature 740° C. for 180 seconds. The present heating temperature is a temperature of a substrate measured with a pyrometer, and the temperature is considered as a present temperature at heat treatment. Alternatively, heat treatment at 550° C. for 4 hours may be performed with an annealing furnace. The crystallizing temperature is lowered and time for crystallization is shortened due to the action of the metal element with the catalytic action.

In order to further improve the crystallinity of a thus formed crystalline silicon film 755, laser treatment is performed (FIG. 16B). The second harmonic (Nd:YVO$_4$ laser, CW, 532 nm) from the light source of the laser oscillator that outputs 10 W with LD excitation is used as laser light 753 and the fundamental wave (Nd:YAG laser, CW, 1.064 μm, TEM$_{00}$) from the light source of the laser oscillator that outputs 30 W is used as laser light 754. When the second harmonic is overlapped with the fundamental wave at an irradiated surface in this way, it is possible to perform crystallization for correcting the irregularity in irradiation, enabling uniform laser treatment, and obtaining high throughput. Thus, a crystallized semiconductor film 756 can be obtained (FIG. 16C).

Figure 17:
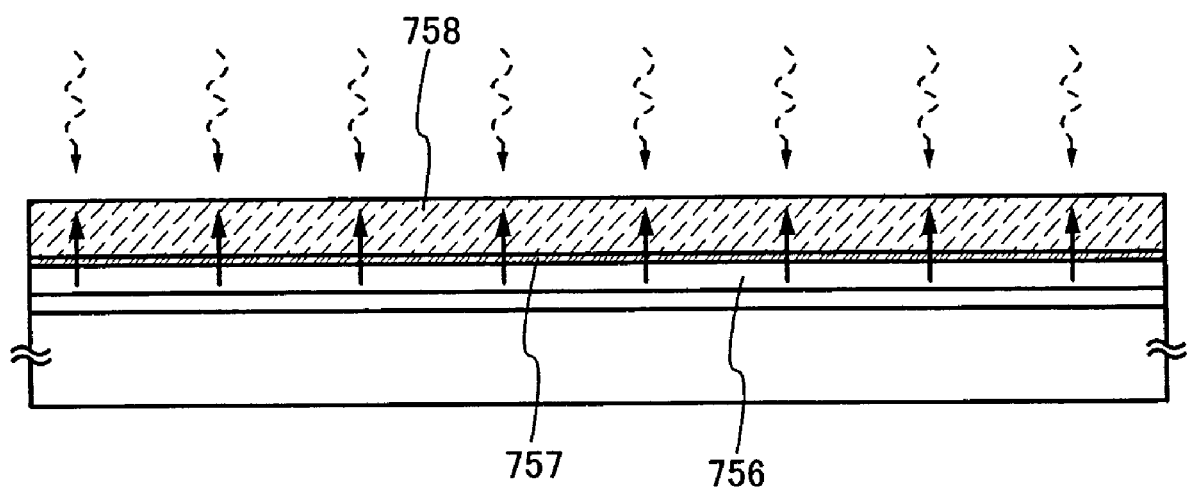
FIG. 17 is a diagram showing the manufacturing method of the semiconductor device according to the embodiment mode of the present invention.

In order to remove an impurity such as metal included in the crystalline silicon film, gettering shown in FIG. 17 is performed, which is especially effective for reducing the metal with the catalytic action, which is added intentionally in the crystallization process, to a concentration of $1\times10^{17}/cm^3$ or less. It is necessary to form newly a gettering site in order to perform gettering to the crystalline silicon film formed in a thin-film shape. In FIG. 17, as the gettering site, an amorphous silicon film 758 is formed over the semiconductor film 756 with a barrier layer 757 therebetween. The amorphous silicon film 758 has an impurity element such as phosphorous or boron, a rare gas element such as Ar, Kr, or Xe, or an element such as oxygen or nitrogen included at $1\times10^{20}/cm^3$ or more to form a distortion. It is preferred that high-frequency sputtering is performed with Ar as sputtering gas to form the amorphous silicon film. It is possible to take any substrate heating temperature at deposition, and for example, a temperature of 150° C. is enough.

As heat treatment thereafter, RTA with a lamp as a heat source or RTA (gas RTA) with heated gas is performed at 750° C. for 180 seconds. Alternatively, heat treatment at 550° C. for 4 hours is performed with a annealing furnace. With the heat treatment, segregation of the metal element to the amorphous silicon film 758 occurs, and it is possible to purify the semiconductor film 756 as a result. After the heat treatment, the amorphous silicon film 758 is removed with dry etching that uses NF$_3$ or CF$_4$, dry etching that does not use plasma of ClF$_3$ or wet etching using alkali solution such as solution including hydrazine or tetra ethyl ammonium hydro oxide ((CH$_3$)$_4$NOH). The barrier layer 756 is removed with hydrofluoric acid etching.

Thus obtained semiconductor film 756 is used as the semiconductor film in any of Embodiment Modes 5 to 8.

Embodiment Mode 11

Figure 18:
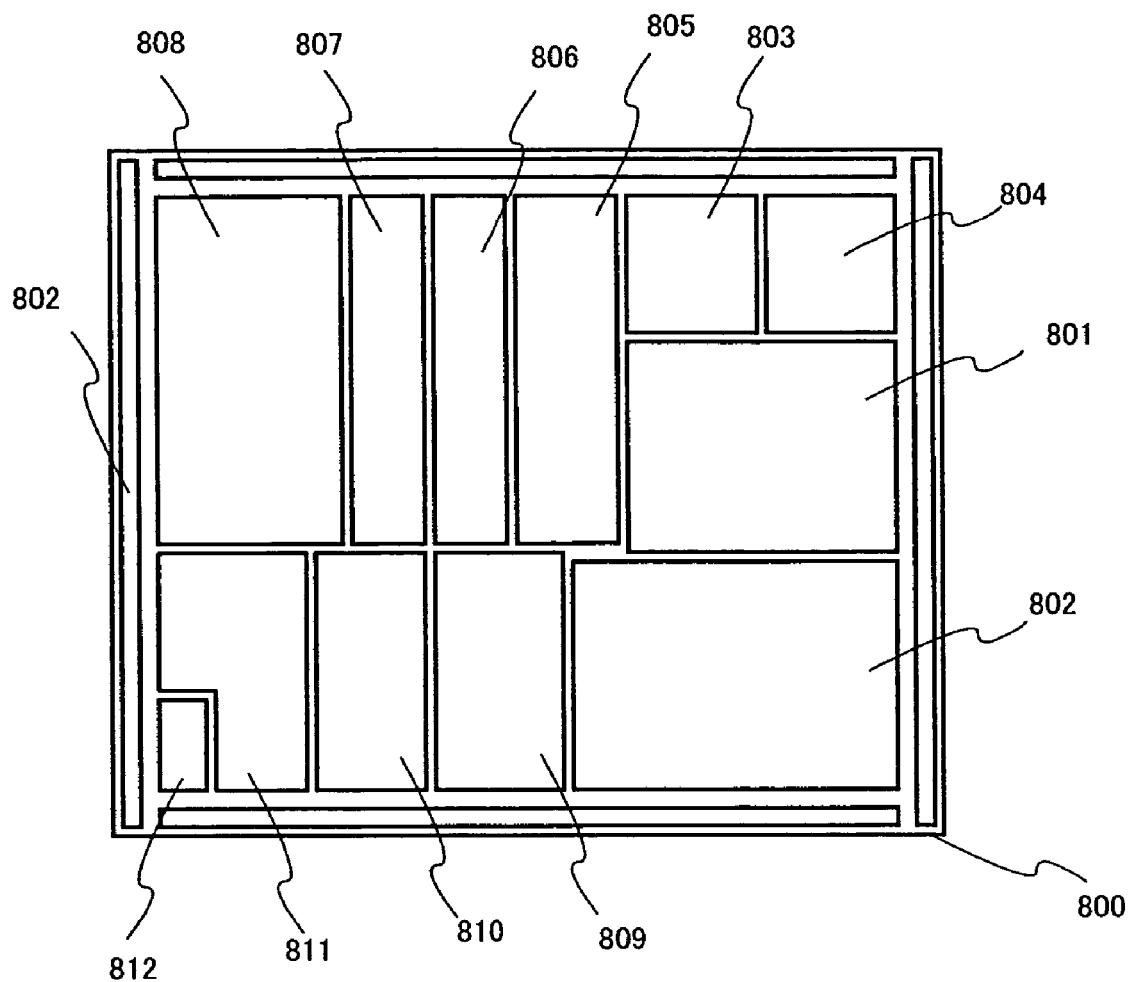
FIG. 18 is a diagram showing a configuration of a microcomputer according to an embodiment mode of the present invention.

An explanation will be given with reference to FIG. 18 on an example of a microcomputer as a typical semiconductor device according to any of Embodiment Modes 5 to 10. As shown in FIG. 18, it is possible to realize a microcomputer 800 with integration of various functional circuit portions on a glass substrate with a thickness from 0.3 to 1.1 mm. The various functional circuit portions can be formed mainly of a TFT or a capacitor manufactured according to any of Embodiment Modes 5 to 10.

The microcomputer 800 includes elements such as a CPU 801, a ROM 802, an interrupt controller 803, a cache memory 804, a RAM 805, a DMAC 806, a clock generating circuit 807, a serial interface 808, a power source generating circuit 809, an ADC/DAC 810, a timer counter 811, a WDT 812, and an I/O port 813.

In the present embodiment mode, the microcomputer is shown as an example. It is also possible to complete various functional semiconductor devices such as a media processor, an LSI for graphics, a cipher LSI, a memory, an LSI for a cellular phone when configurations of various functional circuits or combinations thereof are changed.

In addition, it is possible to manufacture a liquid crystal display device or an EL (electroluminescence) display device with using a TFT formed on a glass substrate. As electronic devices each using such display device, a video camera, a digital camera, a goggles-type display (head mount display), a navigation system, a sound reproduction device (such as an in-car audio system and an audio set), a lap-top computer, a game machine, a portable information terminal (such as a mobile computer, a cellular phone, a portable game machine, and an electronic book), an image reproduction device including a recording medium (more specifically, an device which can reproduce a recording medium such as a digital versatile disc (DVD) and display the reproduced image), and the like can be given. Further, it is also possible to apply the liquid crystal display device or the EL display device as a display device incorporated in an electric home appliance such as a refrigerator, a washing machine, a microwave, a telephone, or a facsimile. As set forth above, the present invention can be applied quite widely to products in various fields.

When the present invention is employed, significant advantages described below can be obtained.

(a) A fundamental wave with a wavelength on the order of 1 μm is not absorbed much in a normal semiconductor thin film with insufficient efficiency. When harmonic is used at the same time, however, the fundamental wave is absorbed more in the semiconductor thin film melted by the harmonic and the annealing efficiency of the semiconductor film becomes better.

(b) When a fundamental wave with a wavelength on the order of 1 μm is irradiated at the same time as harmonic, there are advantages such as suppressing a rapid change in temperature of a semiconductor film and aiding energy of the harmonic with a small output. Unlike the higher harmonic, it is not necessary for the fundamental wave to use a nonlinear optical element for converting a wavelength, and it is possible to obtain a laser beam with a quite large output, for example, with energy more than centuple of that of the higher harmonic. Since the proof strength of the nonlinear optical element against laser is quite weak, such energy difference is caused. In addition, the nonlinear optical element for generating the higher harmonic is likely to change in quality, and there is a disadvantage such as a difficulty in long keeping a maintenance-free state that is an advantage of solid laser. Accordingly, it is quite useful to aid the higher harmonic with the fundamental wave according to the present invention.

(c) It becomes possible to perform uniform annealing to an object to be subjected to irradiation, which is particularly suitable for crystallization of a semiconductor film, improving crystallinity, and activation of an impurity element.

(d) It becomes possible to improve throughput.

(e) With satisfying the advantages above, in a semiconductor device represented by an active matrix liquid crystal display device, it is possible to realize the improvement of operating characteristics of and reliability of the semiconductor device. In addition, it is possible to realize reduction in the production cost of the semiconductor device.

What is claimed is:

1. A method for manufacturing a semiconductor device comprising the steps of:
processing a first laser beam with a wavelength of visible light or a shorter wavelength than visible light into a long beam at a surface of a semiconductor film or a vicinity thereof; and
crystallizing the semiconductor film by irradiating a region of the surface with a second laser beam of a fundamental wave and the long beam at the same time while moving the surface relative to the long beam,
wherein the first laser beam is a harmonic wave of a solid laser, and
wherein the second laser beam is emitted from a continuous wave solid laser and the second laser beam is absorbed in the semiconductor film which is melted by the long beam.

2. A method for manufacturing a semiconductor device according to claim 1, wherein the first laser beam is emitted from a continuous wave solid laser.

3. A method for manufacturing a semiconductor device according to claim 1, wherein each of the first and second laser beam is emitted from one selected from the group consisting of YAG laser, YVO$_4$ laser, YLF laser, YAlO$_3$ laser, ruby laser, and alexandrite laser.

4. A method for manufacturing a semiconductor device according to claim 1, wherein the second laser beam is longer than the long beam at the surface.

5. A method for manufacturing a semiconductor device comprising the steps of:
processing a first laser beam with a wavelength of visible light or a shorter wavelength than visible light into a long beam at a surface of a semiconductor film or a vicinity thereof; and
activating an impurity region formed in the semiconductor film by irradiating a region of the surface with a second laser beam of a fundamental wave and the long beam at the same time while moving the surface relative to the long beam,
wherein the first laser beam is a harmonic wave of a solid laser, and
wherein the second laser beam is emitted from a continuous wave solid laser and the second laser beam is absorbed in the semiconductor film which is melted by the long beam.

6. A method for manufacturing a semiconductor device according to claim 5, wherein the first laser beam is emitted from a continuous wave solid laser.

7. A method for manufacturing a semiconductor device according to claim 5, wherein each of the first and second laser beam is emitted from one selected from the group consisting of YAG laser, YVO$_4$ laser, YLF laser, YAlO$_3$ laser, ruby laser, and alexandrite laser.

8. A method for manufacturing a semiconductor device according to claim 5, wherein the second laser beam is longer than the long beam at the surface.

9. A method for manufacturing a semiconductor device comprising the steps of:
forming a semiconductor layer over a substrate;
forming an insulating layer for covering a top surface and side surface of the semiconductor layer;
forming a conductive layer over the semiconductor layer with the insulating layer interposed therebetween;
processing a first laser beam with a wavelength of visible light or a shorter wavelength than visible light into a long beam at an irradiated surface of the conductive layer or a vicinity thereof; and
heating the conductive layer selectively to perform heat treatment of the semiconductor layer and the insulating layer by irradiating a region of the irradiated surface with a second laser beam of a fundamental wave and the long beam at the same time while moving the irradiated surface relative to the long beam,
wherein the first laser beam is a harmonic wave of a solid laser, and
wherein the second laser beam is emitted from a continuous wave solid laser and the second laser beam is absorbed in the semiconductor film which is melted by the long beam.

10. A method for manufacturing a semiconductor device according to claim 9, wherein the first laser beam is emitted from a continuous wave solid laser.

11. A method for manufacturing a semiconductor device according to claim 9, wherein each of the first and second laser beam is emitted from one selected from the group consisting of YAG laser, YVO$_4$ laser, YLF laser, YAlO$_3$ laser, ruby laser, and alexandrite laser.

12. A method for manufacturing a semiconductor device according to claim 9, wherein the second laser beam is longer than the long beam at the irradiated surface.

13. A method for manufacturing a semiconductor device according to claim 9, wherein the substrate is a glass substrate.

14. A method for manufacturing a semiconductor device comprising the steps of:
processing a first laser beam with a wavelength of visible light or a shorter wavelength than visible light into a long beam at a surface of a semiconductor film or a vicinity thereof; and
crystallizing the semiconductor film by irradiating a region of the surface with a second laser beam of a fundamental wave and the long beam while moving the surface relative to the long beam,
wherein the long beam is overlapped with the second laser beam at the region,
wherein the first laser beam is a harmonic wave of a solid laser, and
wherein the second laser beam is emitted from a continuous wave solid laser and the second laser beam is absorbed in the semiconductor film which is melted by the long beam.

15. A method for manufacturing a semiconductor device according to claim 14, wherein the first laser beam is emitted from a continuous wave solid laser.

16. A method for manufacturing a semiconductor device according to claim 14, wherein each of the first and second laser beam is emitted from one selected from the group consisting of YAG laser, YVO$_4$ laser, YLF laser, YAlO$_3$ laser, ruby laser, and alexandrite laser.

17. A method for manufacturing a semiconductor device according to claim 14, wherein the second laser beam is longer than the long beam at the surface.

18. A method for manufacturing a semiconductor device comprising the steps of:
processing a first laser beam with a wavelength of visible light or a shorter wavelength than visible light into a long beam at a surface of a semiconductor film or a vicinity thereof; and
activating an impurity region formed in the semiconductor film by irradiating a region of the surface with a second laser beam of a fundamental wave and the long beam at the same time while moving the surface relative to the long beam, wherein the long beam is overlapped with the second laser beam at the region, wherein the first laser beam is a harmonic wave of a solid laser, and wherein the second laser beam is emitted from a continuous wave solid laser and the second laser beam is absorbed in the semiconductor film which is melted by the long beam.

19. A method for manufacturing a semiconductor device according to claim 18, wherein the first laser beam is emitted from a continuous wave solid laser.

20. A method for manufacturing a semiconductor device according to claim 18, wherein each of the first and second laser beam is emitted from one selected from the group consisting of YAG laser, YVO$_4$ laser, YLF laser, YAlO$_3$ laser, ruby laser, and alexandrite laser.

21. A method for manufacturing a semiconductor device according to claim 18, wherein the second laser beam is longer than the long beam at the surface.

* * * * *